(12) United States Patent
Youn et al.

(10) Patent No.: US 11,398,619 B2
(45) Date of Patent: Jul. 26, 2022

(54) DISPLAY DEVICE WITH REFLECTIVE LIGHT GUIDE STRUCTURE

(71) Applicant: LG Display Co., Ltd., Seoul (KR)

(72) Inventors: Wooram Youn, Paju-si (KR); Jang Jo, Paju-si (KR)

(73) Assignee: LG Display Co., Ltd., Seoul (KR)

(*) Notice: Subject to any disclaimer, the term of this patent is extended or adjusted under 35 U.S.C. 154(b) by 306 days.

(21) Appl. No.: 16/722,735

(22) Filed: Dec. 20, 2019

(65) Prior Publication Data

US 2020/0203667 A1 Jun. 25, 2020

(30) Foreign Application Priority Data

Dec. 21, 2018 (KR) ........................ 10-2018-0167953

(51) Int. Cl.
| | | |
|---|---|---|
| H01L 51/52 | (2006.01) | |
| H01L 27/32 | (2006.01) | |
| G02B 27/01 | (2006.01) | |
| G06F 1/16 | (2006.01) | |

(52) U.S. Cl.
CPC ........ *H01L 51/5271* (2013.01); *H01L 27/322* (2013.01); *H01L 27/3209* (2013.01); *H01L 27/3211* (2013.01); *H01L 27/3246* (2013.01); *H01L 27/3248* (2013.01); *G02B 27/0172* (2013.01); *G02B 2027/0112* (2013.01); *G06F 1/163* (2013.01); *H01L 2251/5315* (2013.01)

(58) Field of Classification Search
CPC ............. H01L 51/5271; H01L 27/3209; H01L 27/3211; H01L 27/3246; H01L 27/3248; H01L 2251/5315; G02B 27/0172; G02B 2027/0112; G06F 1/163

USPC ........................................................... 257/88
See application file for complete search history.

(56) References Cited

U.S. PATENT DOCUMENTS

| | | | | |
|---|---|---|---|---|
| 2006/0012291 A1* | 1/2006 | Chang | ................. | G02B 6/0055 313/504 |
| 2013/0001612 A1* | 1/2013 | Lee | ..................... | H01L 51/5265 257/98 |
| 2014/0353607 A1* | 12/2014 | Kim | ..................... | H01L 27/3248 257/40 |
| 2018/0190740 A1* | 7/2018 | Bang | ................... | H01L 51/5234 |

OTHER PUBLICATIONS

Extended European Search Report dated May 15, 2020, issued in counterpart European Patent Application No. 19214644.7.

* cited by examiner

*Primary Examiner* — Xia L Cross
(74) *Attorney, Agent, or Firm* — Morgan, Lewis & Bockius LLP

(57) ABSTRACT

A display device is disclosed. The display device includes a substrate provided with a plurality of subpixels including a first light emitting area and a second light emitting area, a first electrode in the first light emitting area of each of the plurality of subpixels on the substrate, a first light emitting layer provided on the first electrode, a second electrode provided on the first light emitting layer, a second light emitting layer provided on the second electrode, a third electrode provided on the second light emitting layer, and a light guide structure provided between the substrate and the first electrode, guiding light emitted from the first light emitting layer to be emitted to the second light emitting area.

16 Claims, 15 Drawing Sheets

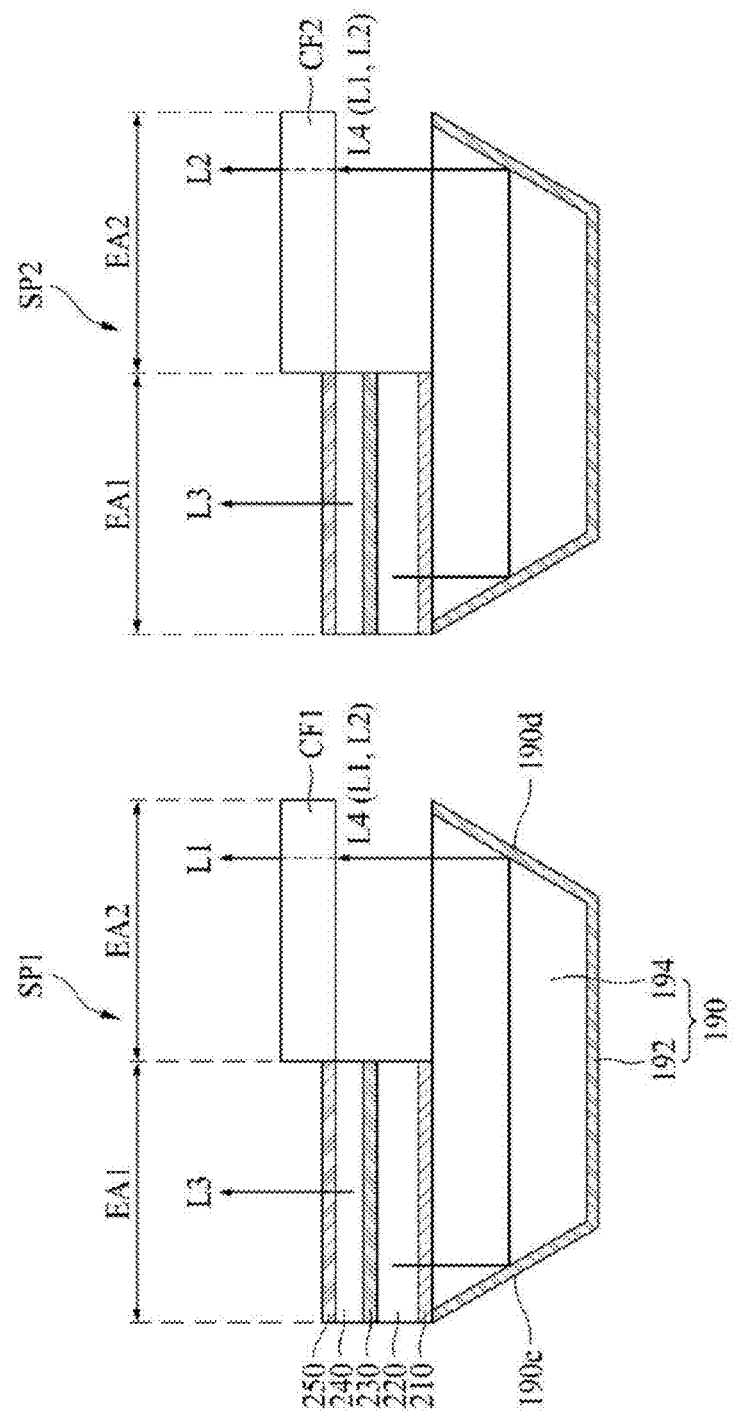

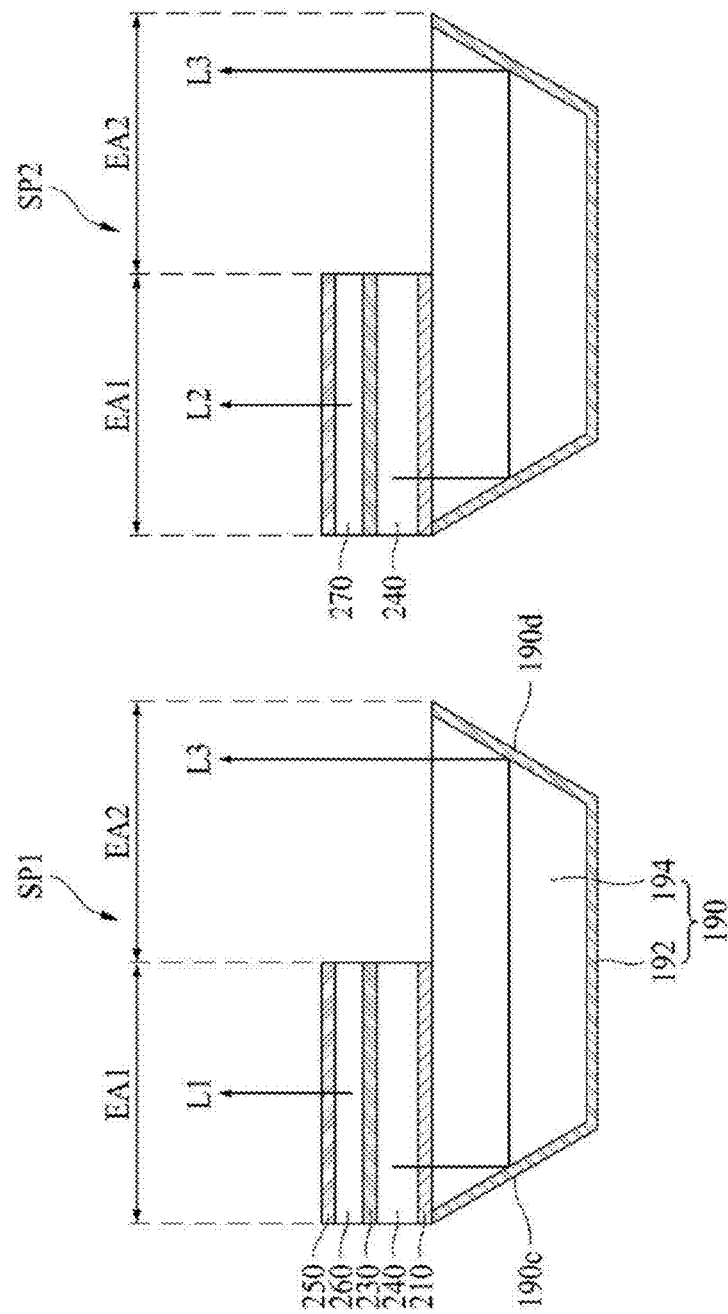

DISPLAY DEVICE WITH REFLECTIVE LIGHT GUIDE STRUCTURE

This application claims the benefit of Korean Application No. 10-2018-0167953, filed on Dec. 21, 2018, which is hereby incorporated by reference.

BACKGROUND

Technical Field

The present disclosure relates to a display device displaying an image.

Discussion of the Related Art

With the advancement of the information age, the demand for a display device for displaying an image has increased with various forms. Therefore, various types of display devices such as a liquid crystal display (LCD) device and a plasma display panel (PDP) device, a quantum dot light emitting display (QLED) device and an organic light emitting display (OLED) device have been recently used.

Among the display devices, the organic light emitting display device is a self-light emitting device, and has advantages in that a viewing angle and a contrast ratio are more excellent than those of the liquid crystal display (LCD) device. Also, since the organic light emitting display device does not require a separate backlight, it is advantageous that the organic light emitting display device is able to be thin and lightweight and has low power consumption. Furthermore, the organic light emitting display device has advantages in that it may be driven at a low direct current voltage, has a fast response speed, and especially has a low manufacturing cost.

Recently, a head mounted display (HMD) including such a display device has been developed. The head mounted display (HMD) is a glasses or helmet type monitor device of virtual reality (VR) or augmented reality (AR), which forms a focal point on a close distance in front of eyes of a user who wears the HMD in glasses or helmet type.

In case of the head mounted display, it is difficult to accurately form and pattern a light emitting layer of different colors for each of subpixels by using a fine metal mask (FMM) due to a compact pixel interval.

SUMMARY

Accordingly, embodiments of the present disclosure are directed to a display device that substantially obviates one or more of the problems due to limitations and disadvantages of the related art.

The present disclosure has been made in view of the above problems, and an object of the present disclosure is to provide a display device of high resolution. Another object of the present disclosure is to provide a display device of high resolution, while having a compact pixel interval.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a substrate provided with a plurality of subpixels including a first light emitting area and a second light emitting area, a first electrode in the first light emitting area of each of the plurality of subpixels on the substrate, a first light emitting layer provided on the first electrode, a second electrode provided on the first light emitting layer, a second light emitting layer provided on the second electrode, a third electrode provided on the second light emitting layer, and a light guide structure provided between the substrate and the first electrode, guiding light emitted from the first light emitting layer to be emitted to the second light emitting area.

In another aspect of the present disclosure, a display device comprises a substrate provided with a plurality of pixels each having a first and a second subpixel, wherein each subpixel includes a first light emitting area and a second light emitting area, a first electrode in the first light emitting area, a first light emitting layer provided on the first electrode, a second electrode provided on the first light emitting layer, a second light emitting layer provided on the second electrode, a third electrode provided on the second light emitting layer, and a light guide structure provided between the substrate and the first electrode for guiding light emitted from the first light emitting layer to be emitted from the second light emitting area. The light guide structure may be provided between the substrate and the first electrode in the first light emitting area. The light guide structure may be provided in or extend over both the first and second light emitting area of one subpixel.

The following features may be defined with a display device according to any of the above described aspects of the disclosure.

The pixel may comprise only two subpixels. For example, the pixel may consist of two subpixels. The pixel may be defined as a unit configured to display or emit all colors. The subpixel may be a unit configured to emit two different colors, e.g., a first color from the first light emitting area and a second color from the second light emitting area, the first and second color being different from each other. The first and second subpixel may be arranged alternately in at least one direction, e.g. in a direction parallel to the gate lines or to the data lines. Each subpixel may include a first and a second light emitting area adjacent to each other. The first, the second and the third electrode may be arranged in the first light emitting area of each subpixel. Further, the first and second electrode may be formed only in the first light emitting area or may be arranged to expose the second light emitting area of each subpixel. Likewise, the first light emitting layer and the second light emitting layer may be formed only in the first light emitting area or may be arranged to expose the second light emitting area of each subpixel.

The second electrode may be a reflective electrode. Alternatively, or additionally, the first electrode and/or the third electrode may be transparent electrodes.

The second electrode may be configured to reflect light emitted from the first light emitting layer toward the light guide structure.

The second electrode may be configured to reflect light emitted from the second light emitting layer toward the third electrode.

The second electrode may be a cathode electrode, and the first and third electrodes may be anode electrodes. Alternatively, the second electrode may be an anode electrode and the first and third electrodes may be cathode electrodes.

The light emitted from the second light emitting layer may be emitted to the first light emitting area.

The light guide structure may include a lower surface having a first width, an upper surface having a second width greater than the first width, and first and second inclined surfaces for connecting the lower surface with the upper surface. The upper surface may be adjacent to or facing the first electrode, while the lower surface of the light guide structure is opposite to the upper surface. The first and second inclined surfaces may be arranged one after the other along a direction, along which first and second light emitting area of one subpixel are arranged, e.g., along a direction of an imaginary line connecting the first and second light emitting area of one subpixel. The first inclined surface may be arranged in the first light emitting area of one subpixel and the second inclined surface may be arranged in the second light emitting area of the one subpixel. Thus, the light guide structure may be provided separately for each subpixel and extend over the first and the second light emitting area of one subpixel.

The light guide structure may include a reflector forming a reflective space comprised of the lower surface, the first inclined surface and the second inclined surface below the first electrode. The reflector may be configured for guiding the light emitted from the first light emitting layer to the second light emitting area by reflecting the light on the reflective space. The light guide structure may further include a dielectric filled in the reflective space. For example, the light guide structure may include a reflector formed on the lower surface and the first and second inclined surfaces thereof for forming a reflective space, in which a dielectric is filled.

A first driving thin film transistor may be provided on the substrate. The first driving thin film transistor may comprise an active layer, a gate electrode, a source electrode and a drain electrode. The reflector of the light guide structure may be connected to a source electrode or a drain electrode of the first driving thin film transistor.

The reflector of the light guide structure may electrically connect the first electrode with a source electrode or a drain electrode of the first driving thin film transistor. For instance, a first inclined surface of the light guide structure may electrically connect the first electrode with a source electrode or a drain electrode of the first driving thin film transistor.

A second driving thin film transistor may be provided on the substrate. The second driving thin film transistor may comprise an active layer, a gate electrode, a source electrode and a drain electrode. The third electrode may be connected to the second driving thin film transistor. Each subpixel of one pixel may include the second driving thin film transistor. Alternatively, the two subpixels of one pixel share one second driving thin film transistor, e.g., the second driving thin film transistor is commonly provided for the two subpixels of one pixel.

The third electrode may be formed in each of first and second subpixels adjacent to each other, e.g., in each of first and second subpixels of one pixel. The third electrode may be shared by or integrally formed for two adjacent subpixels, e.g., the two subpixels of one pixel. The third electrode provided in the first subpixel and the third electrode provided in the second subpixel may be connected to each other and/or connected to the same second driving thin film transistor. Alternatively, the third electrode may be separately formed in the first and second subpixels of one pixel. In this case, each of the subpixels may comprise a second driving thin film transistor.

The first electrode may be directly in contact with the reflector of the light guide structure.

The light guide structure may include a first area, e.g. in the first light emitting area of one subpixel, which is overlapped with the first electrode and a second area, e.g. in the second light emitting area of the one subpixel, which is not overlapped with the first electrode, e.g., which is exposed by the first electrode.

The second light emitting area may be formed in the second area of the light guide structure.

The first and second light emitting layers may be configured to emit light at different wavelength ranges. The first light emitting layer may emit light of a first color wavelength range and light of a second color wavelength range. The second light emitting layer may emit light of a third color wavelength range. The first light emitting area may emit light of the third color wavelength range. The second light emitting area may emit only a part of the light of the first color wavelength range and the light of the second color wavelength range.

A color filter may be arranged on the light guide structure to correspond to the second light emitting area of each of the plurality of subpixels, emitting only a part of the light of the wavelength range emitted by the first light emitting layer, e.g., only part of the light of the first color wavelength range and the light of the second color wavelength range if the light emitted from the first light emitting layer enters the color filter.

Each of the plurality of subpixels may include a first subpixel and a second subpixel. The color filter may include a first color filter arranged to correspond to a second light emitting area of the first subpixel and a second color filter arranged to correspond to a second light emitting area of the second subpixel. The first color filter and the second color filter may transmit light of different wavelength ranges. For instance, the first color filter may transmit only the light of the first color wavelength range of the light of the first color wavelength range and the light of the second color wavelength range, and the second color filter transmits only the light of the second color wavelength range of the light of the first color wavelength range and the light of the second color wavelength range.

One pixel includes the first subpixel and the second subpixel, the pixel being configured to emit light of three different color wavelength ranges. The first light emitting layers of the first and second subpixels may be configured to emit light of the same color wavelength range and the second light emitting layers of the first and second subpixels may be configured to emit light of different color wavelength ranges. Alternatively, the first light emitting layers of the first and second subpixels may be configured to emit light of different color wavelength ranges and the second light emitting layers of the first and second subpixels may be configured to emit light of the same color wavelength range. Each of the plurality of subpixels may include a first subpixel and a second subpixel, and the first subpixel and the second subpixel may emit light of a first color wavelength range, light of a second color wavelength range and light of a third color wavelength range.

At least one of the first and second light emitting layer of the first subpixel of one pixel may be made of a different material and/or configured to emit at a different color wavelength range than a corresponding one of the first and second light emitting layer of the second subpixel of said pixel. Alternatively, the first light emitting layers of the first and second subpixels of one pixel may be made of the same material and/or configured to emit at the same color wavelength range, and/or the second light emitting layers of the first and second subpixels of one pixel may be made of the same material and/or configured to emit at the same color wavelength range.

The first light emitting layer of the first subpixel may emit the light of the first color wavelength range. The first light emitting layer of the second subpixel may emit the light of the second color wavelength range.

Each of the second light emitting layer of the first subpixel and the second light emitting layer of the second subpixel may emit light of a third color wavelength range.

A power line may be provided between the first electrode and the substrate and supplied with a power source from a pad, wherein the second electrode is connected to the power line through a contact hole.

The display device may further comprise a lens array including a plurality of lenses arranged in front of the substrate to magnify images displayed in the subpixels, and a storage case for storing the substrate and the lens array.

The display device according to any of the embodiments set out above may be a head mounted display device.

According to the present disclosure, each subpixel may allow the first light emitting layer and the second light emitting layer to independently emit light. Therefore, in the present disclosure, power consumption may be reduced more remarkably than the display device having a tandem structure in which a plurality of stacks is arranged by interposing a charge generating layer therebetween.

Also, in the present disclosure, a light emitting layer may be formed to be patterned in only the first light emitting area and may be not formed in the second light emitting area. Also, the same light emitting layers are formed to be patterned in the first subpixel and the second subpixel. In other words, the first and the second light emitting layer may be formed in the first light emitting area of each subpixel. For example, the first and the second light emitting layer may expose the second light emitting area of each subpixel. Moreover, the second light emitting area may exist between the first light emitting area of the first subpixel and the first light emitting area of the second subpixel. Thus, a fine metal mask (FMM) does not need to move, whereby an interval between the first subpixel and the second subpixel may be minimized even though the light emitting layer may be formed to be patterned using the FMM.

Also, in the present disclosure, light emitted between the first electrode and the second electrode may be guided to the second light emitting area through the light guide structure and then emitted to an outside. Therefore, in the present disclosure, light efficiency in the second light emitting area may be improved remarkably.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIG. 7 is a view briefly illustrating a path of light in a first subpixel and a second subpixel;

FIG. 14 is a view briefly illustrating a path of light in a first subpixel and a second subpixel of FIGS. 13.

DETAILED DESCRIPTION

Figure 1:
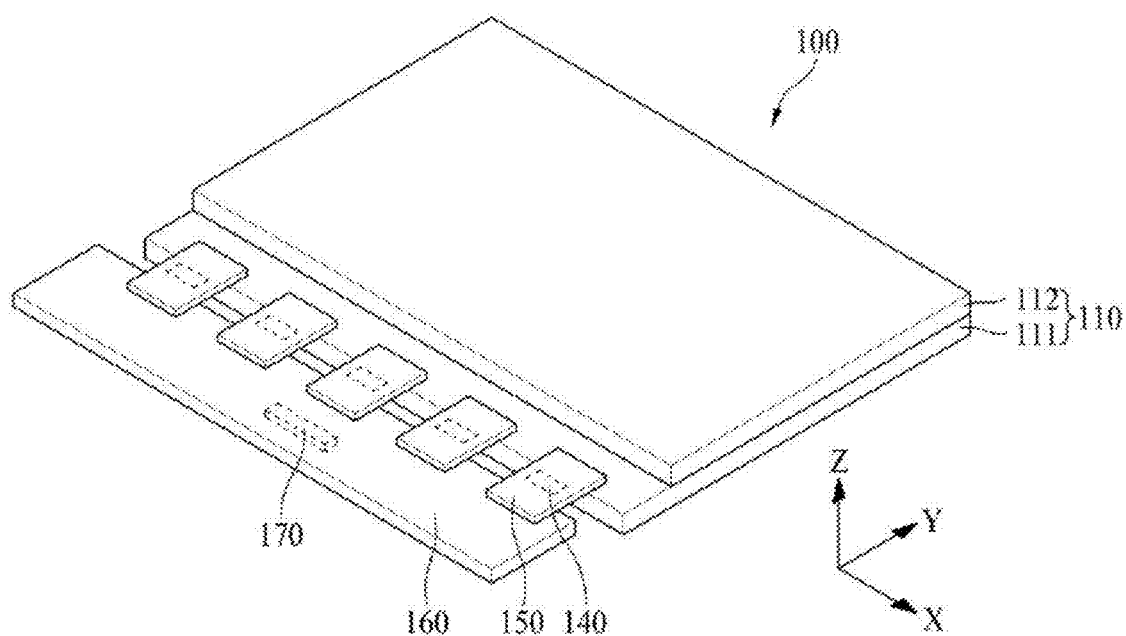
FIG. 1 is a perspective view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In the case in which "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

"X-axis direction", "Y-axis direction" and "Z-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the embodiments of the display device according to the present disclosure will be described in detail with reference to the accompanying drawings.

Figure 2:
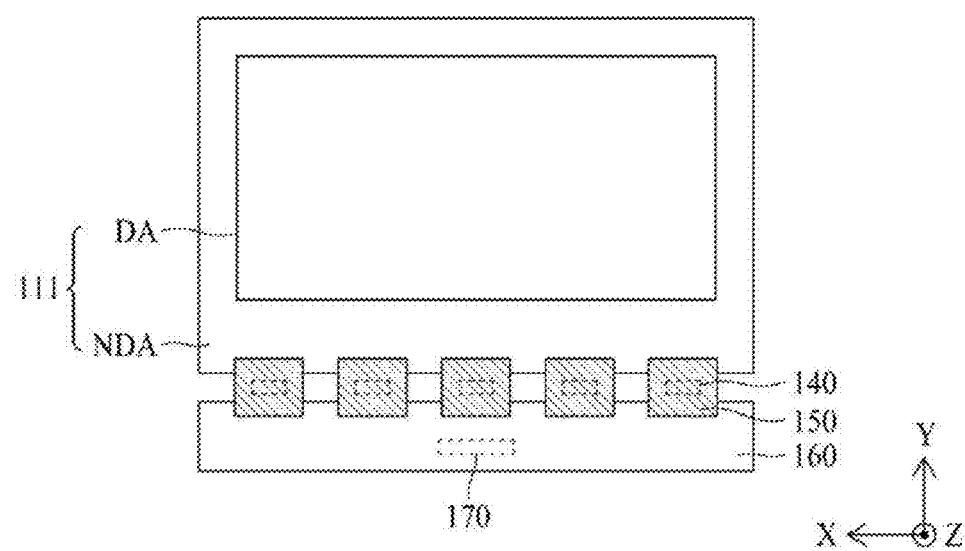
FIG. 2 is a plane view illustrating a first substrate, a source drive IC, a flexible film, a circuit board, and a timing controller of FIG. 1.

FIG. 1 is a perspective view illustrating a display device according to one embodiment of the present disclosure. FIG. 2 is a plane view illustrating a first substrate, a source drive IC, a flexible film, a circuit board, and a timing controller of FIG. 1.

With reference to FIGS. 1 and 2, the display device 100 according to one embodiment of the present disclosure includes a display panel 110, a source drive integrated circuit 140 (hereinafter, referred to as "IC"), a flexible film 150, a circuit board 160, and a timing controller 170.

The display panel 110 includes a first substrate 111 and a second substrate 112. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film.

A plurality of gate lines, a plurality of data lines, and a plurality of subpixels are formed on one surface of the first substrate 111 facing the second substrate 112. The subpixels are provided in a plurality of areas defined by an intersection structure of the gate lines and the data lines.

The display panel 110 may be divided into a display area DA where pixels are formed to display an image, and a non-display area NDA that does not display an image. The gate lines, the data lines, and the pixels may be formed in the display area DA. A gate driver and pads may be formed in the non-display area NDA.

The gate driver sequentially supplies gate signals to the gate lines in accordance with a gate control signal input from the timing controller 170. The gate driver may be formed in the non-display area NDA outside one side or both sides of the display area DA of the display panel 110 in a gate driver-in-panel (GIP) type. Alternatively, the gate driver may be manufactured as a driving chip, may be packaged in a flexible film, and may be attached to the non-display area NDA outside one side or both sides of the display area DA of the display panel 110 in a tape automated bonding (TAB) type.

The source drive IC 140 receives digital video data and a source control signal from the timing controller 170. The source driver IC 140 converts the digital video data into analog data voltages in accordance with the source control signal, and supplies the analog data voltages to the data lines. If the source drive IC 140 is manufactured as a driving chip, the source drive IC 140 may be packaged in the flexible film 150 in a chip-on-film (COF) type or a chip-on-plastic (COP) type.

A plurality of pads, such as data pads, may be formed in the non-display area NDA of the display panel 110. Lines connecting the pads with the source drive IC 140 and lines connecting the pads with lines of the circuit board 160 may be formed in the flexible film 150. The flexible film 150 may be attached onto the pads using an anisotropic conductive film, whereby the pads may be connected with the lines of the flexible film 150.

The circuit board 160 may be attached onto the flexible films 150. A plurality of circuits embodied as driving chips may be packaged in the circuit board 160. For example, the timing controller 170 may be packaged in the circuit board 160. The circuit board 160 may be a printed circuit board (PCB) or a flexible printed circuit board (FPCB).

The timing controller 170 receives the digital video data and a timing signal from an external system board through a cable of the circuit board 160. The timing controller 170 generates a gate control signal for controlling an operation timing of the gate driver and a source control signal for controlling the source drive ICs 140 based on the timing signal. The timing controller 170 supplies the gate control signal to the gate driver, and supplies the source control signal to the source drive ICs 140.

Figure 3:
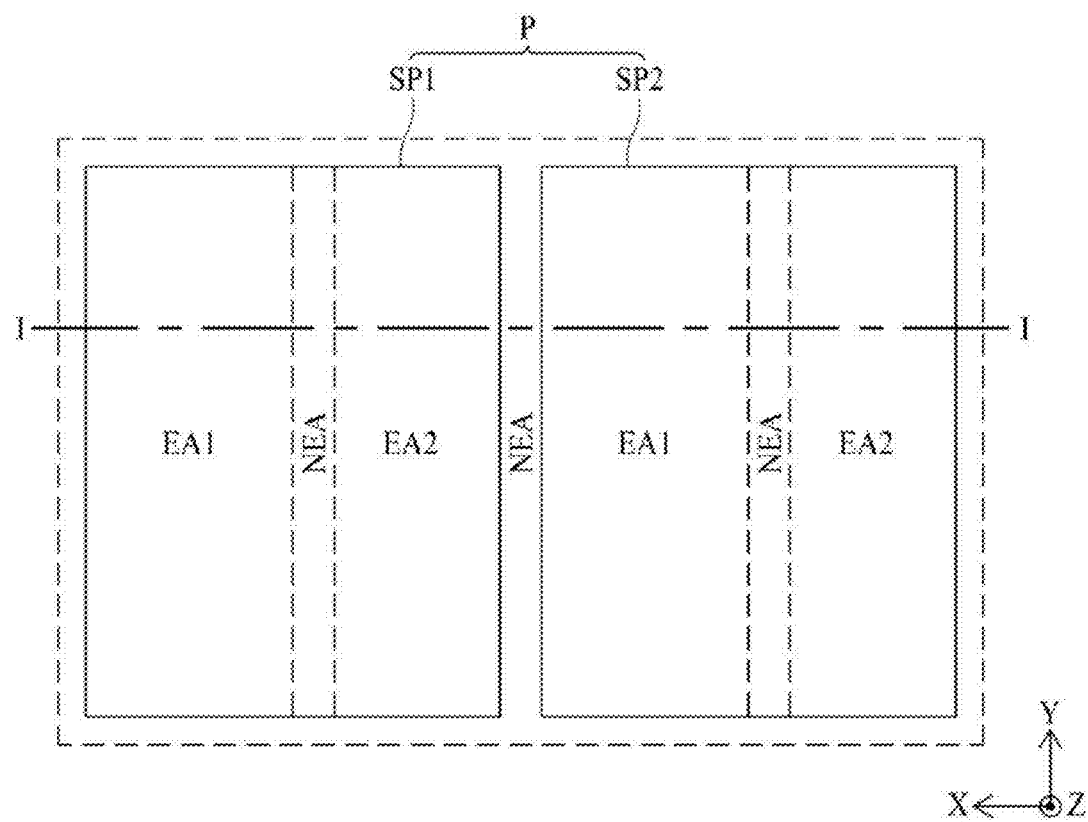
FIG. 3 is a plane view briefly illustrating pixels of a display device according to the one embodiment of the present disclosure.

FIG. 3 is a plane view briefly illustrating pixels of a display device according to one embodiment of the present disclosure.

With reference to FIG. 3, the pixels P for displaying an image are formed on the display area DA. Each of the pixels P includes two subpixels, for example, a first subpixel SP1 and a second subpixel SP2.

The display device 100 according to one embodiment of the present disclosure may be configured such that light of at least three colors can be emitted from the pixel including the first subpixel SP1 and the second subpixel SP2. Here, the first subpixel may emit light of two different colors, and the second subpixel may emit light of two different colors. One of the colors of light emitted by the first subpixel and one of the colors of light emitted by the second subpixel may be the same.

In more detail, the first subpixel SP1 may include a first light emitting area EA1 and a second light emitting area EA2. The first subpixel SP1 may emit light of a first color in the first light emitting area EA1. The first subpixel SP1 may emit light of a second color in the second light emitting area EA2. The first subpixel SP1 may be provided with a non-light emitting area NEA between the first light emitting area EA1 and the second light emitting area EA2. The first, second and third color may be different from each other.

The second subpixel SP2 may include a first light emitting area EA1 and a second light emitting area EA2. The second subpixel SP2 may emit light of a first color in the first light emitting area EA1. The second subpixel SP2 may emit light of a third color in the second light emitting area EA2. The second subpixel SP2 may be provided with a non-light emitting area NEA between the first light emitting area EA1 and the second light emitting area EA2.

Therefore, the first subpixel SP1 and the second subpixel SP2 may emit light of the first color, light of the second color and light of the third color.

Hereinafter, the first subpixel SP1 and the second subpixel SP2 will be described in more detail with reference to various embodiments.

First Embodiment

Figure 4:
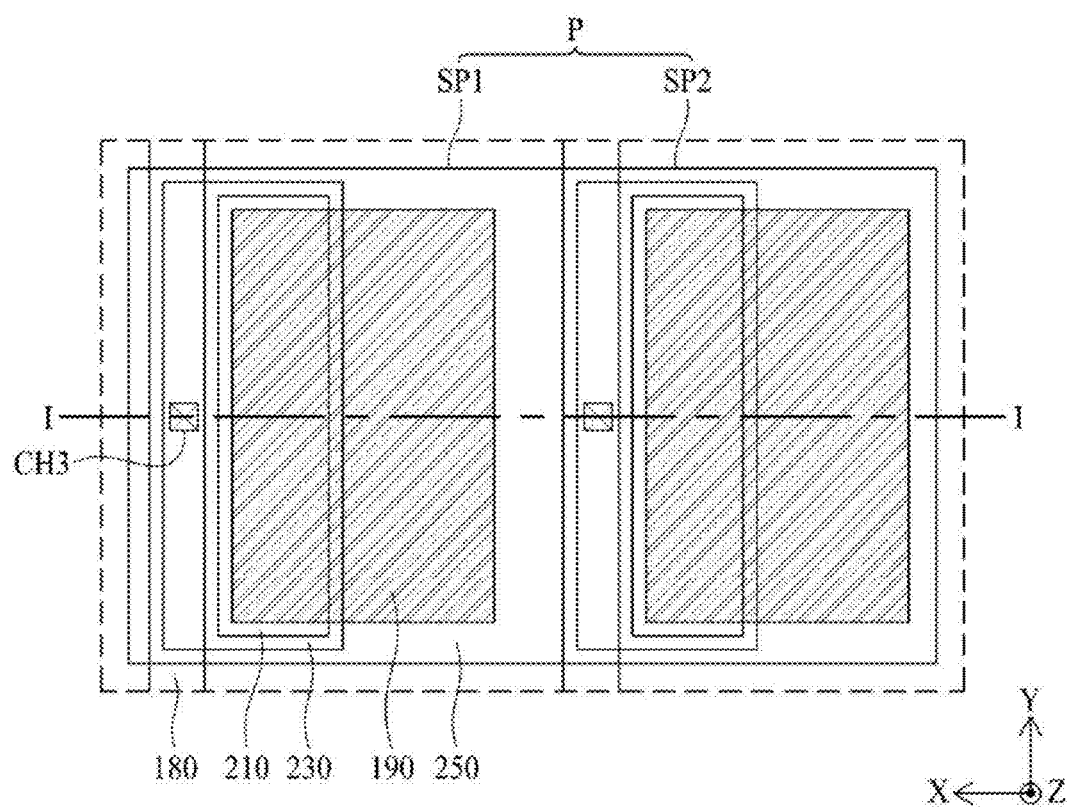
FIG. 4 is a plane view briefly illustrating a light guide structure, a first electrode, a second electrode and a third electrode of subpixels.
Figure 5:
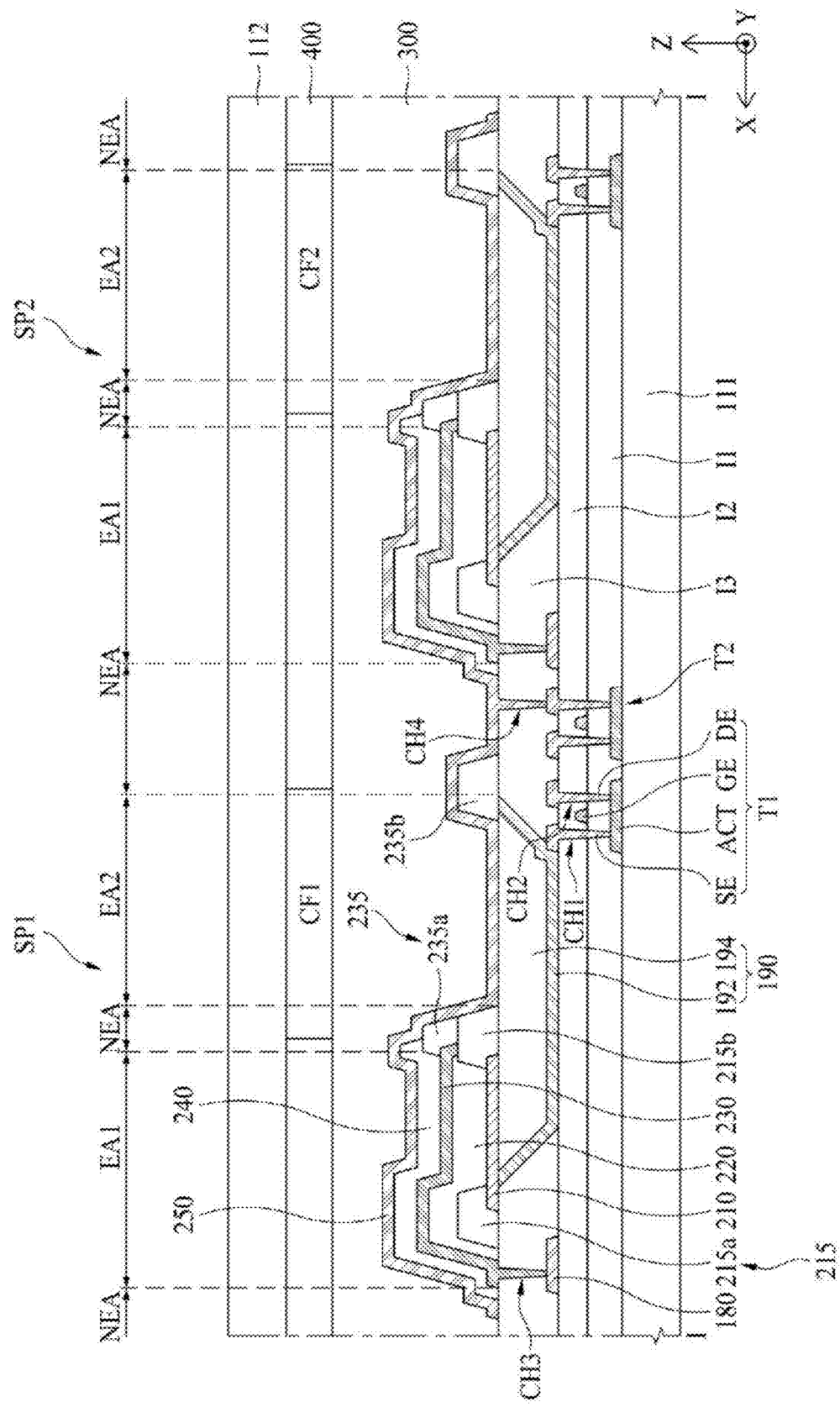
FIG. 5 is a cross-sectional view illustrating a first example taken along line I-I of FIG. 3.
Figure 6A:
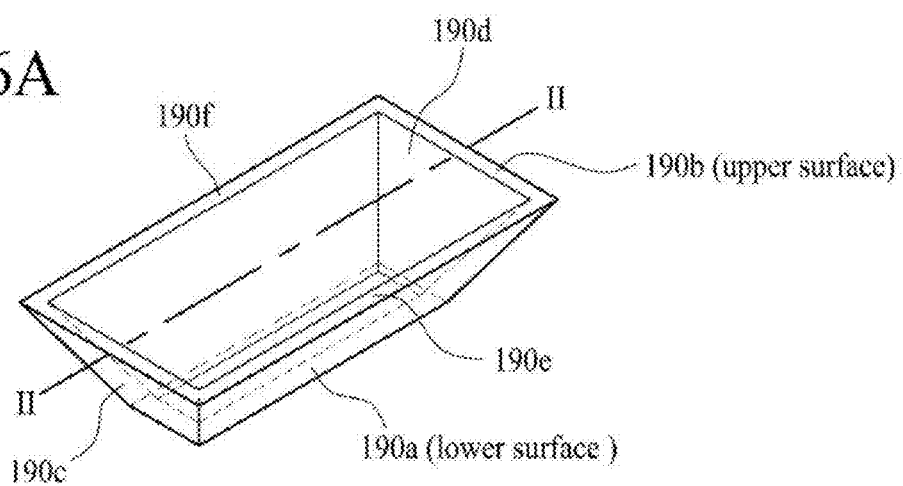
FIG. 6A is a perspective view briefly illustrating a light guide structure shown in FIG. 5.
Figure 6B:
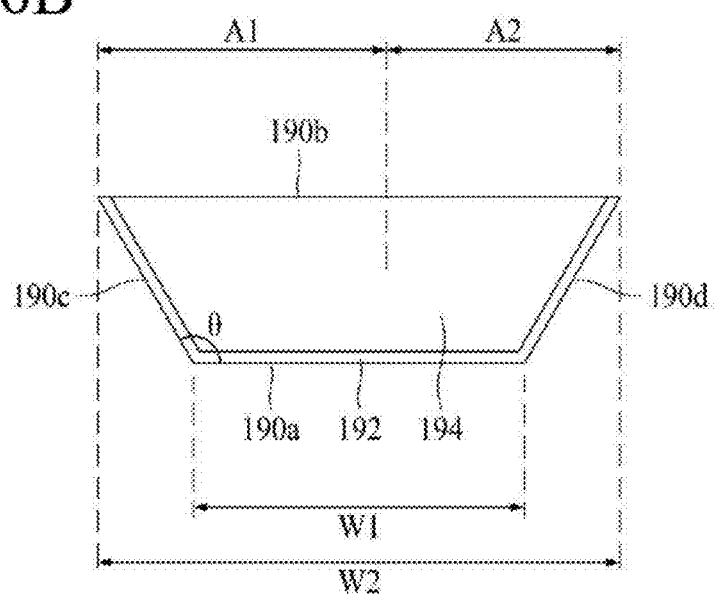
FIG. 6B is a cross-sectional view taken along line II-II of a light guide structure shown in FIG. 6A.
Figure 8:
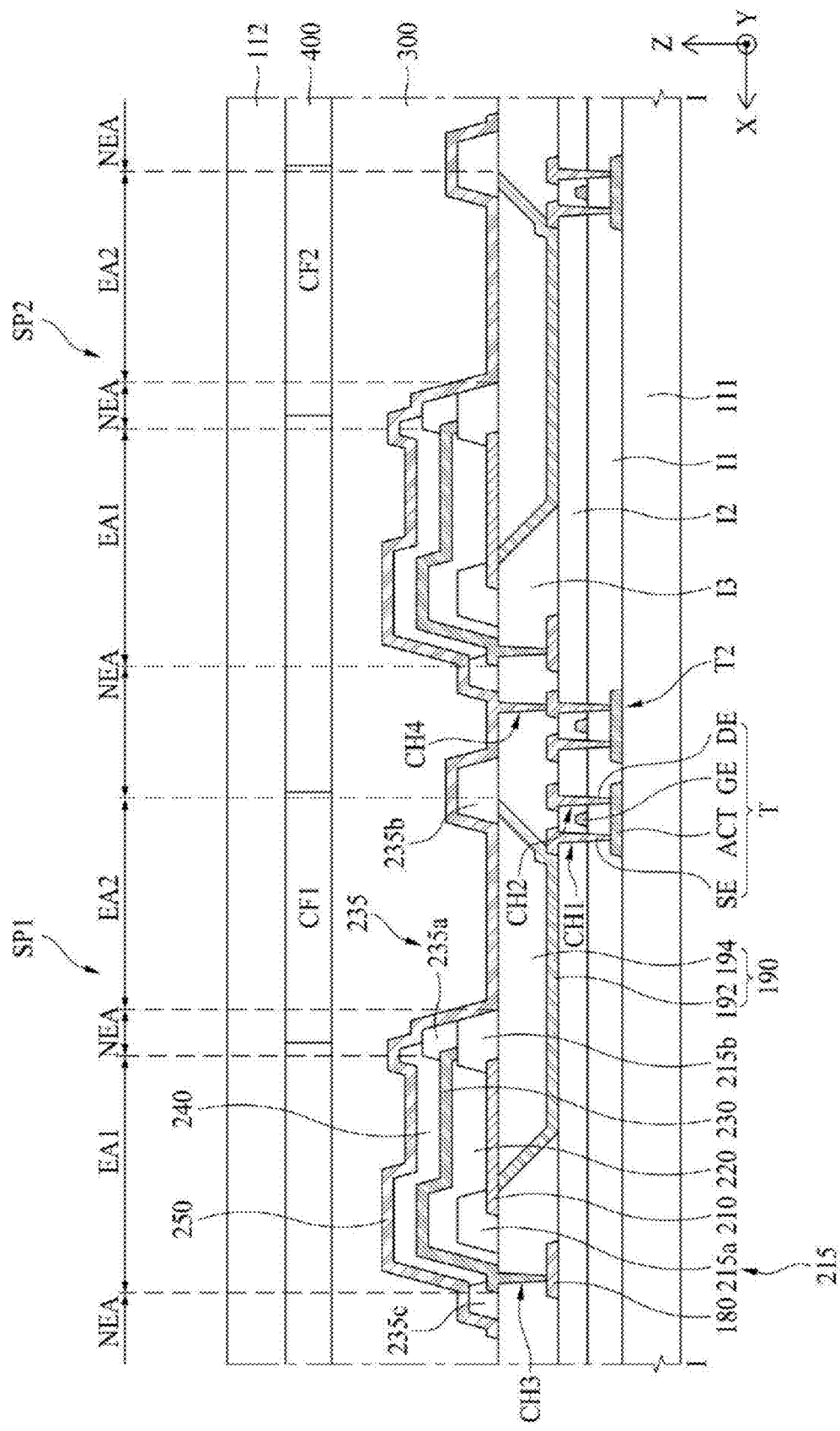
FIG. 8 is a cross-sectional view illustrating a modified embodiment of FIG. 5.
Figure 9:
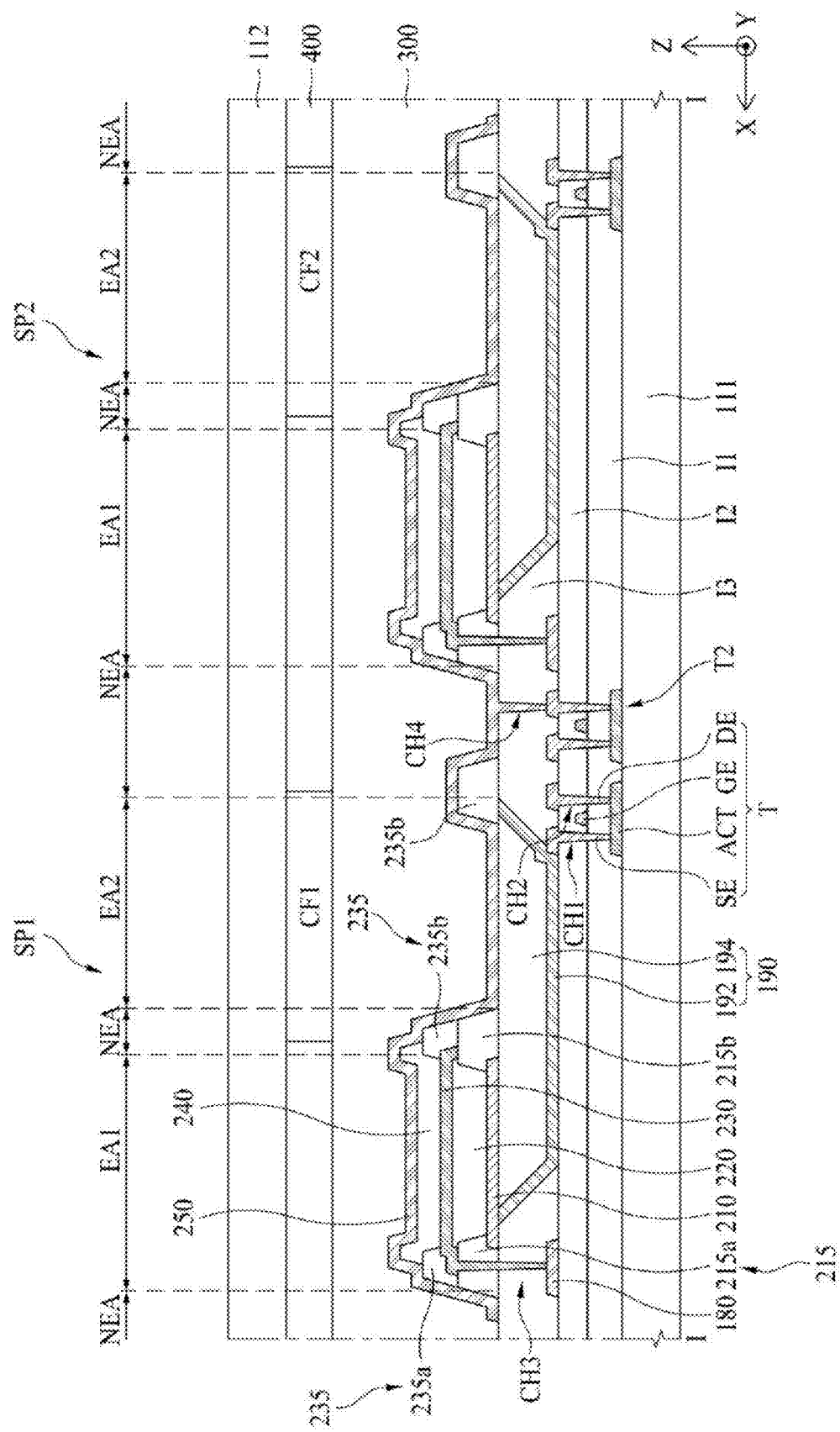
FIG. 9 is a cross-sectional view illustrating another modified embodiment of FIG. 5.
Figure 10:
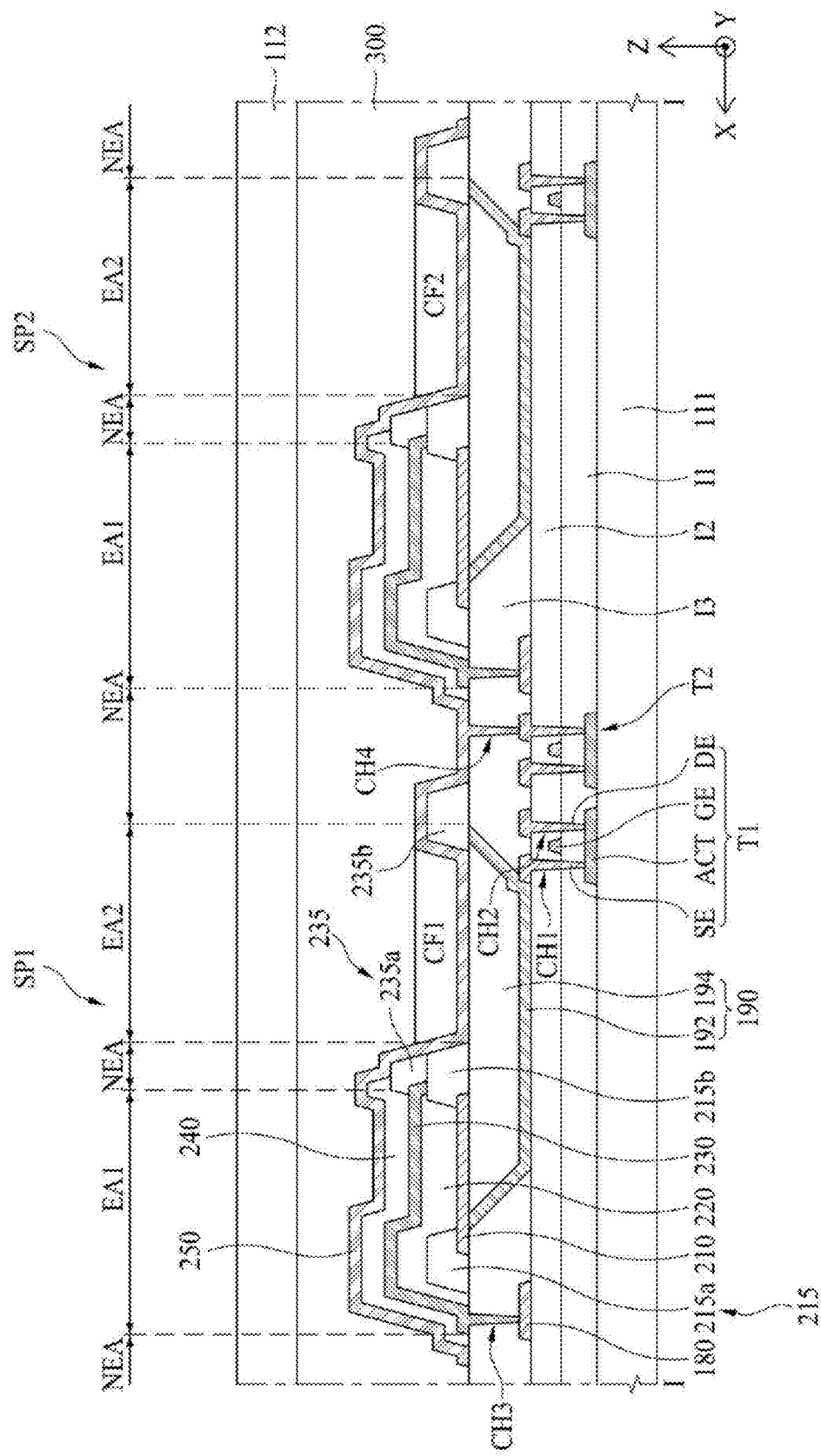
FIG. 10 is a cross-sectional view illustrating other modified embodiment of FIG. 5.

FIG. 4 is a plane view briefly illustrating a light guide structure, a first electrode, a second electrode and a third electrode of subpixels, FIG. 5 is a cross-sectional view illustrating a first example taken along line I-I of FIG. 3, FIG. 6A is a perspective view briefly illustrating a light guide structure shown in FIG. 5, and FIG. 6B is a cross-sectional view taken along line II-II of a light guide structure shown in FIG. 6A. FIG. 7 is a view briefly illustrating a path of light in a first subpixel and a second subpixel, FIG. 8 is a cross-sectional view illustrating a modified embodiment of FIG. 5, FIG. 9 is a cross-sectional view illustrating another modified embodiment of FIG. 5, and FIG. 10 is a cross-sectional view illustrating other modified embodiment of FIG. 5.

With reference to FIGS. 4 to 7, the display device according to the first embodiment of the present disclosure comprises a first substrate 111, a second substrate 112, a first driving thin film transistor T1, a second driving thin film transistor T2, a power line 180, a light guide structure 190, a first electrode 210, a first bank 215, a second bank 235, a first light emitting layer 220, a second electrode 230, a second light emitting layer 240, a third electrode 250, an encapsulation layer 300, and a color filter layer 400.

The first substrate 111 may be a plastic film, a glass substrate, or a silicon wafer substrate formed using a semiconductor process. The first substrate 111 may be made of a transparent material or an opaque material.

Since the display device 100 according to the first embodiment of the present disclosure is provided in a top emission type in which light is emitted to an upper portion, not only a transparent material but also an opaque material may be used as the first substrate 111.

A first subpixel SP1 and a second subpixel SP2 may be provided on the first substrate 111. The first subpixel SP1 may be provided to emit blue (B) and green (G) lights, and the second subpixel SP2 may be provided to emit blue (B) and red (R) lights, but these subpixels are not limited to this case. Also, an arrangement sequence of the subpixels SP1 and SP2 may be changed in various ways.

Hereinafter, for convenience of description, it is assumed that the first subpixel SP1 emits blue (B) and red(R) light, and the second subpixel SP2 may emit blue (B) and green (G) light.

A circuit element comprising various types of signal lines, a first driving thin film transistor T1, a second driving thin film transistor T2 and a capacitor is formed on the substrate 111 for each of the subpixels SP1 and SP2. The signal lines may include gate lines, data lines, power lines 180 and reference lines.

The first driving thin film transistor T1 supplies a predetermined voltage to the first electrode 210 in accordance with data voltages of the data lines if gate signals are input to the gate lines.

The second driving thin film transistor T2 is provided for each of the subpixels, and supplies a predetermined voltage to the third electrode 250 in accordance with the data voltages of the data lines if the gate signals are input to the gate lines. One second driving thin film transistor T2, as shown in FIG. 5, may be shared by, but not limited to, the first subpixel SP1 and the second subpixel SP2. In this case, also the third electrode may be shared by the first subpixel SP1 and the second subpixel SP2. In another embodiment, the second driving thin film transistor T2 may be provided for each of the subpixels SP1 and SP2 in the same manner as the first driving thin film transistor T1.

Each of the first driving thin film transistor T1 and the second driving thin film transistor T2 includes an active layer ACT, a gate electrode GE, a source electrode SE, and a drain electrode DE.

The active layer ACT is formed on the first substrate 111. The active layer ACT may be formed of a silicon based semiconductor material or an oxide based semiconductor material. A light shielding layer (not shown) for shielding external light entering the active layer ACT may further be formed between the first substrate 111 and the active layer ACT.

A gate insulating film I1 may be formed on the active layer ACT. The gate insulating film I1 may be formed of an inorganic film, for example, a silicon oxide (SiOx) film, a silicon nitride (SiNx) film, or a multi-layered film of SiOx and SiNx.

A gate electrode GE may be formed on the gate insulating film I1. The gate electrode GE may be, but not limited to, a single layer or multi-layer comprised of any one of Mo, Al, Cr, Au, Ti, Ni, Nd and Cu or their alloy.

An inter-layer dielectric film I2 may be formed on the gate electrode GE. The inter-layer dielectric film I2 may be formed of an inorganic film, for example, a silicon oxide (SiOx) film, a silicon nitride (SiNx) film, or a multi-layered film of SiOx and SiNx.

A source electrode SE and a drain electrode DE may be formed on the inter-layer dielectric film I2. Each of the source electrode SE and the drain electrode DE may be connected to the active layer ACT through contact holes CH1 and CH2 that pass through the gate insulating film I1 and the inter-layer dielectric film I2. Each of the source electrode SE and the drain electrode DE may be, but not limited to, a single layer or multi-layer comprised of any one of Mo, Al, Cr, Au, Ti, Ni, Nd and Cu or their alloy.

Meanwhile, the power line 180 may further be provided on the inter-layer dielectric film I2. The power line 180 is arranged on each of the subpixels SP1 and SP2 in the display area DA and connected with the second electrode 230. The power line 180 may be provided to be extended in a second direction (Y-axis direction) in the display area DA. The plurality of the first subpixels SP1 may be arranged along a second direction, and the plurality of the second subpixels SP2 may be arranged along a second direction. In this case, the power line 180 may be connected with the second electrode 230 of each of the plurality of the first subpixels SP1 arranged along the second direction, and may be connected with the second electrode 230 of each of the plurality of the second subpixels SP2 arranged along the second direction. One end of the power line 180 may be connected to a pad, whereby an external power source may be supplied from the pad to the power line 180.

The power line 180 may be formed of, but not limited to, the same material as that of the source electrode SE and the drain electrode DE of the first and second driving thin film transistors T1 and T2. The power line 180 may be formed of the same material on the same layer as the active layer ACT or the gate electrode GE of the first and second driving thin film transistors T1 and T2.

A planarization film I3 may be provided on the source electrode SE and the drain electrode DE of the first and second driving thin film transistors T1 and T2 and the power line 180. The planarization film I3 planarizes a step difference due to the first and second driving transistors T1 and T2.

The planarization film I3 may include an opening portion. The opening portion may be provided between the first driving thin film transistors T1 provided in each of the subpixels SP1 and SP2. The opening portion, as shown in FIG. 5, may be provided to partially expose the inter-layer dielectric film I2 and the source electrode SE or the drain electrode DE of the first driving thin film transistor T1, but is not limited to this example. In another embodiment, the opening portion may be provided without fully passing through the planarization film I3 after the planarization film I3 is partially removed as much as some thickness.

The planarization film I3 may be formed of, but not limited to, an organic film such as acryl resin, epoxy resin, phenolic resin, polyamide resin, and polyimide resin.

The light guide structure 190 is provided on the opening portion of the planarization film I3 and guides light emitted from the first light emitting layer 220 to be emitted to the second light emitting area EA2.

The light guide structure 190, as shown in FIGS. 6A and 6B, may include a lower surface 190a having a first width W1 and an upper surface 190b having a second width W2 greater than the first width W1. The lower surface 190a and the upper surface 190b of the light guide structure 190 may have a rectangular shape. In this case, the light guide structure 190 may be provided with four sides 190c, 190d, 190e and 190f provided to connect the lower surface 190a with the upper surface 190b. Also, since the first width W1 of the lower surface 190a in the light guide structure 190 is smaller than the second width W2 of the upper surface 190b, four sides 190c, 190d, 190e and 190f may be inclined surfaces. At this time, each of the inclined surfaces 190c, 190d, 190e and 190f has an inclined angle θ greater than 90° with respect to the lower surface 190a.

The light guide structure 190 may be comprised of a reflector 192 and a dielectric 194.

The reflector 192 provides a reflective space comprised of the lower surface 190a and the inclined surfaces 190c, 190d, 190e and 190f. The reflector 192 is formed of a metal material having high reflectivity, for example, Al, Ag, etc., and reflects light emitted from the first light emitting layer 220 from the reflective space and guides the light to the second light emitting area EA2.

Meanwhile, the reflector 192 is connected to a portion of the source electrode SE or the drain electrode DE of the first driving thin film transistor T1. Therefore, a first voltage may be applied from the source electrode SE or the drain electrode DE of the first driving thin film transistor T1 to the reflector 192. The reflector 192, as shown in FIG. 5, may directly be provided in a portion of the source electrode SE or the drain electrode DE of the first driving thin film transistor T1 exposed to the opening portion of the planarization film I3, but is not limited to this case. In another embodiment, the reflector 192 may be connected to a portion of the source electrode SE or the drain electrode DE of the first driving thin film transistor T1 through a contact hole.

The dielectric 194 is provided to fill the reflective space such that a step difference between the upper surface 190b and the planarization film I3 is not generated.

The first electrode 210 may be provided to be patterned in each of the first subpixel SP1 and the second subpixel SP2. For example, one first electrode 210 is provided in the first subpixel SP1, and the other first electrode 210 is provided in the second subpixel SP2. In other words, the first electrodes 210 are separately formed for the subpixels SP1 and SP2. The first electrode 210 may be formed in the first light emitting area EA1 of each subpixel, while exposing the second light emitting area EA2.

The first electrode 210 is provided on the light guide structure 190 and connected to the reflector 192 of the light guide structure 190. In detail, the first electrode 210 may be provided such that the lower surface is directly in contact with one end of the first inclined surface 190c of the reflector 192. Therefore, a first voltage may be applied from the source electrode SE or the drain electrode DE of the first driving thin film transistor T1 to the first electrode 210 through the reflector 192 of the light guide structure 190.

The first electrode 210, as shown in FIGS. 4 and 5, is provided to partially expose a portion of the upper surface 190b of the light guide structure 190 and cover the other portion of the upper surface 190b of the light guide structure 190. Therefore, the light guide structure 190 is provided with a first area A1 overlapped with the first electrode 210 and a second area A2 which is not overlapped with the first electrode 210.

The first electrode 210 may be formed of a transparent conductive material (TCO) such as ITO and IZO to allow light emitted from the first light emitting layer 220 to enter the light guide structure 190. The first electrode 210 may be an anode electrode.

The first bank 215 may be provided on the light guide structure 190 or the planarization film I3 to cover an end of the first electrode 210. In detail, one end of the first electrode 210 may be provided on the planarization film I3, and the other end of the first electrode 210 may be provided on the dielectric 194 of the light guide structure 190. A first bank 215a may be provided on the planarization film I3 to cover one end of the first electrode 210. Also, a first bank 215b may be provided on the dielectric 194 of the light guide structure 190 to cover the other end of the first electrode 210. Therefore, luminance efficiency may be prevented from being deteriorated due to a current concentrated on the end of the first electrode 210.

The first bank 215 may be formed of a relatively thin inorganic insulating film but may be formed of a relatively thick organic insulating film. Also, the first bank 215 may include a material capable of absorbing light, for example, a black dye. Therefore, the first bank 215 may prevent a color mixture from occurring between the first light emitting area EA1 and the second light emitting area EA2.

The first light emitting layer 220 is provided to be patterned in each of the first subpixel SP1 and the second subpixel SP2. One first light emitting layer 220 is provided in the first subpixel SP1, and the other first light emitting layer 220 is provided in the second subpixel SP2.

The first light emitting layer 220 is provided on the first electrode 210. The first light emitting layer 220 may also be provided on the first bank 215. Particularly, the first light emitting layer 220 may be provided on a first side, an upper surface and a second side of the first bank 215a provided on the planarization film I3 to cover one end of the first electrode 210, wherein the second side of the first bank 215a faces its first side. However, without limitation to this example, in another embodiment, the first light emitting layer 220, as shown in FIG. 9, may be provided on only a portion of the first side and the upper surface of the first bank 215a provided on the planarization film I3 to cover one end of the first electrode 210. The first light emitting layer 220 may be formed separately for the first and the second subpixels SP1 and SP2. The first light emitting layer 220 may be formed in the first light emitting area EA1 of each subpixel, while exposing the second light emitting area EA2.

The first light emitting layer 220 may include a hole transporting layer, a light emitting layer, and an electron transporting layer. If a first voltage is applied to the first electrode 210 and a second voltage is applied to the second electrode 230, holes and electrons move to the first light emitting layer 220 through the hole transporting layer and the electron transporting layer, respectively, and are combined with each other in the corresponding light emitting layer to emit light of a predetermined color.

The first light emitting layer 220 may be any one of, but not limited to, a red light emitting layer for emitting red light, a green light emitting layer for emitting green light, a blue light emitting layer for emitting blue light, and a yellow light emitting layer for emitting yellow light.

The second electrode 230 may be provided to be patterned in each of the first subpixel SP1 and the second subpixel SP2. For example, one second electrode 230 is provided in the first subpixel SP1, and the other second electrode 230 is provided in the second subpixel SP2. In other words, the second electrodes 230 are separately formed for the subpixels SP1 and SP2. The second electrode 230 may be formed in the first light emitting area EA1 of each subpixel, while exposing the second light emitting area EA2.

The second electrode 230 is provided on the first light emitting layer 220. As shown in FIG. 5, one end of the second electrode 230 may be provided on the planarization film I3, and the other end of the second electrode 230 may be provided on the first bank 215b. In this case, the second electrode 230 may be connected to the power line 180 at one end through a contact hole CH3 that passes through the planarization film I3. However, the second electrode 230 is not limited to this example. In another embodiment, one end and the other end of the second electrode 230, as shown in FIG. 9, may be provided on the first banks 215a and 215b. In this case, the second electrode 230 may be connected to the power line 180 at one end through a contact hole CH3 that passes through the planarization film I3 and the first bank 215a. Therefore, a second voltage may be applied to the second electrode 230 through the power line 180.

The second electrode 230 may reflect light emitted from the first light emitting layer 220 toward the light guide structure 190 and reflect light emitted from the second light emitting layer 240 toward the third electrode 250, for example, the front.

To this end, the second electrode 230 may be formed of a metal material of high reflectivity such as a deposited structure (Ti /Al/Ti) of aluminum and titanium, a deposited structure (ITO/Al/ITO) of aluminum and ITO, an Ag alloy, and a deposited structure (ITO/Ag alloy/ITO) of Ag alloy and ITO. The Ag alloy may be an alloy of silver (Ag), palladium (Pb), and Copper (Cu).

The second bank 235 may be provided on the first bank 215 to partially cover the end of the second electrode 230. In detail, one end of the second electrode 230 may be provided on the planarization film I3, and the other end of the electrode 230 may be provided on the first bank 215b.

The second bank 235a may be provided to cover the other end of the second electrode 230 provided on the first bank 215b. Therefore, luminance efficiency may be prevented from being deteriorated due to a current concentrated on the other end of the second electrode 230.

On the other hand, the second bank 235, as shown in FIG. 5, may not cover one end of the second electrode 230 provided on the planarization film I3. As the second bank 235 does not cover one end of the second electrode 230 provided on the planarization film 13, the first light emitting area EA1 may have a wider area.

However, although FIG. 5 illustrates that the second bank 235 does not cover one end of the second electrode 230 provided on the planarization film I3, the second bank 235 is not limited to the example of FIG. 5. In another embodiment, a second bank 235c, as shown in FIG. 8, may be provided to cover one end of the second electrode 230 provided on the planarization film I3. Also, the second bank 235a may be provided to cover the other end of the second electrode 230 provided on the first bank 215b. Therefore, luminance efficiency may be prevented from being deteriorated due to a current concentrated on one end and the other end of the second electrode 230.

The second bank 235 may be provided to partially cover the reflector 192 of the light guide structure 190. The reflector 192 of the light guide structure 190 may be exposed in the second light emitting area EA2. If the third electrode 250 is deposited on the exposed reflector 192, the first electrode 210 and the third electrode 250 may electrically be connected with each other. In this case, the first light emitting layer 220 and the second light emitting layer 240 cannot be driven independently. The second bank 235b may be provided to cover the exposed reflector 192 such that the reflector 192 and the third electrode 250 may electrically be insulated from each other.

The second bank 235 may be formed of a relatively thin inorganic insulating film but may be formed of a relatively thick organic insulating film. Also, the second bank 235 may include a material capable of absorbing light, for example, a black dye. Therefore, the second bank 235 may prevent a color mixture from occurring between the first light emitting area EA1 and the second light emitting area EA2.

The second light emitting layer 240 may be provided to be patterned in each of the first subpixel SP1 and the second subpixel SP2. For example, one second light emitting layer 240 is provided in the first subpixel SP1, and the other second light emitting layer 240 is provided in the second subpixel SP2. The second light emitting layer 240 may be formed separately for the first and the second subpixels SP1 and SP2. The second light emitting layer 240 may be formed in the first light emitting area EA1 of each subpixel, while exposing the second light emitting area EA2.

The second light emitting layer 240 is provided on the second electrode 230. The second light emitting layer 240 may also be provided on the second bank 235a.

The second light emitting layer 240 may include a hole transporting layer, a light emitting layer, and an electron transporting layer. If a third voltage is applied to the third electrode 250 and a second voltage is applied to the second electrode 230, holes and electrons move to the second light emitting layer 240 through the hole transporting layer and the electron transporting layer, respectively, and are combined with each other in the corresponding light emitting layer to emit light of a predetermined color.

The second light emitting layer 240 may be any one of, but not limited to, a red light emitting layer for emitting red light, a green light emitting layer for emitting green light, a blue light emitting layer for emitting blue light, and a yellow light emitting layer for emitting yellow light.

However, the second light emitting layer 240 may emit light of a color different from that of the first light emitting layer 220. If the first light emitting layer 220 is a light emitting layer for emitting light of a first color wavelength range and a second color wavelength range, the second light emitting layer 240 may be a light emitting layer for emitting light of a third color wavelength range. For example, the first light emitting layer 220 may be a yellow light emitting layer for emitting yellow light which is a mixed color of red and green, and the second light emitting layer 240 may be a blue light emitting layer for emitting blue light.

The third electrode 250, as shown in FIG. 5, may be provided for each of pixels P but is not limited to the example of FIG. 5. If the second driving thin film transistor T2 is shared by the first subpixel SP1 and the second subpixel SP2 included in one pixel P, the third electrode 250 may be shared by the first subpixel SP1 and the second subpixel SP2 included in the one pixel P. Further, the third electrode 250 may be provided separately for each of the pixels P.

In another embodiment, if the second driving thin film transistor T2 is provided for each of the subpixels SP1 and SP2, the third electrode 250 may be provided separately for each of the subpixels SP1 and SP2.

One third electrode 250 is provided on the second light emitting layer 240 provided in each of the first subpixel SP1 and the second subpixel SP2, the dielectric 194 of the light guide structure 190, and the second bank 235*b*. The dielectric 194 of the light guide structure 190, as shown in FIG. 5, may be provided to expose a partial area of the second light emitting area EA2 in which the second electrode 210 is not formed. The third electrode 250 may be formed with a wide width to cover the dielectric 194 of the light guide structure 190 and the second bank 235*b* as well as the second light emitting layer 240.

The third electrode 250 may be connected to the second driving thin film transistor T2 through a contact hole CH4 that passes through the planarization film I3. Therefore, a third voltage may be applied from the source electrode SE or the drain electrode DE of the second driving thin film transistor T2 to the third electrode 250. In this case, the third voltage may be different from the first voltage applied to the first electrode 210.

The third electrode 250 may be formed of a transparent conductive material (TCO) such as ITO and IZO to allow light emitted from the second light emitting layer 240 to transmit therethrough. The third electrode 250 may be an anode electrode.

The encapsulation layer 300 may be provided to cover the third electrode 250. The encapsulation layer 300 serves to prevent oxygen or water from being permeated into the first light emitting layer 220, the second light emitting layer 240 and the third electrode 250. To this end, the encapsulation layer 300 may include at least one inorganic film and at least one organic film.

In detail, the encapsulation layer 300 may include a first inorganic film and an organic film. In one embodiment, the encapsulation layer 300 may further include a second inorganic film.

The first inorganic film is provided to cover the third electrode 250. The organic film is provided on the first inorganic film. It is preferable that the organic film is formed at a sufficient thickness to prevent particles from being permeated into the first light emitting layer 220, the second light emitting layer 240 and the third electrode 250 by passing through the first inorganic film. The second inorganic film is formed to cover the organic film. The second inorganic film may be omitted.

Each of the first and second inorganic film may be formed of a silicon nitride, an aluminum nitride, a zirconium nitride, a titanium nitride, a hafnium nitride, a tantalum nitride, a silicon oxide, an aluminum oxide, or a titanium oxide. The first and second inorganic films may be deposited by, but not limited to, a Chemical Vapor Deposition (CVD) method or an Atomic Layer Deposition (ALD) method.

The organic film may be formed of acrylic resin, epoxy resin, phenolic resin, polyamide resin, or polyimide resin. The organic film may be formed by, but not limited to, a vapor deposition method, a printing method, and a slit coating method. The organic film may be formed by an ink-jet process.

The color filter layer 400, as shown in FIG. 5, may be provided on, but not limited to, the encapsulation layer 300. In another embodiment, the color filter 400, as shown in FIG. 10, may be provided between the encapsulation layer 300 and the third electrode 250.

The color filter layer 400 may include a first color filter CF1 arranged to correspond to the second light emitting area EA2 of the first subpixel SP1 and a second color filter CF2 arranged to correspond to the second light emitting area EA2 of the second subpixel SP2. The first color filter CF1 and the second color filter CF2 may transmit their respective lights of color wavelength ranges different from each other.

For example, the first light emitting layer 220 may be a yellow light emitting layer for emitting yellow light. The first color filter CF1 may be a red color filter for transmitting light of a red wavelength range, and the second color filter CF2 may be a green color filter for transmitting light of a green wavelength range. Therefore, the red light may be emitted from the second light emitting area EA2 of the first subpixel SP1, and the green light may be emitted from the second light emitting area EA2 of the second subpixel SP2.

Meanwhile, a color filter may not be arranged in a position corresponding to each of the first light emitting area EA1 of the first subpixel SP1 and the first light emitting area EA1 of the second subpixel SP2.

For example, the second light emitting layer 240 may be a blue light emitting layer for emitting blue light. Therefore, the blue light may be emitted from each of the first light emitting area EA1 of the first subpixel SP1 and the first light emitting area EA1 of the second subpixel SP2 even without passing through a separate color filter.

The second substrate 112 is provided to face a first surface of the first substrate 111. At this time, the first surface of the first substrate 111 corresponds to a surface where the first driving thin film transistor T1, the second driving thin film transistor T2, the power line 180, the light guide structure 190, the first electrode 210, the first bank 215, the second bank 235, the first light emitting layer 220, the second electrode 230, the second light emitting layer 240, the third electrode 250 and the encapsulation layer 300 are formed. The second substrate 112 is an encapsulation substrate, and may be a plastic film, a glass substrate, or an encapsulation film.

In the display device 100 according to the first embodiment of the present disclosure, although one pixel P includes two subpixels SP1 and SP2, lights of at least three colors may be emitted from one pixel P including the two subpixels SP1 and SP2.

For example, the first light emitting layer 220 may be a yellow light emitting layer for emitting light L4 of a yellow wavelength range where light L1 of a red wavelength range is mixed with light L2 of a green wavelength range, and the second light emitting layer 240 may be a blue light emitting layer for emitting light L3 of a blue wavelength range.

Each of the first subpixel SP1 and the second subpixel SP2, as shown in FIG. 7, includes a first light emitting area EA1 and a second light emitting area EA2.

The light L3 emitted from the second light emitting layer 240 may be emitted from the first light emitting area EA1 of the first subpixel SP1. If the third voltage is applied to the third electrode 250 and the second voltage is applied to the second electrode 230, the second light emitting layer 240 may emit the light L3 of the blue wavelength range. At this time, the emitted light L3 of the blue wavelength range may move to the front by passing through the third electrode 250. Alternatively, after the emitted light L3 of the blue wavelength range is reflected on the second electrode 230, the light L3 may move to the front by passing through the third electrode 250. Therefore, the first subpixel SP1 emits the light L3 of the blue wavelength range from the first light emitting area EA1.

The light L1 of the red wavelength range in the light L4 emitted from the first light emitting layer 220 may be emitted from the second light emitting area EA2 of the first subpixel SP1. If the first voltage is applied to the first electrode 210 and the second voltage is applied to the second electrode 230, the first light emitting layer 220 may emit the light L4 of the yellow wavelength range where the light L1 of the red wavelength range is mixed with the light L2 of the green wavelength range. At this time, the emitted light L4 of the yellow wavelength range may be reflected on the reflector 192 arranged on the first inclined surface 190c of the light guide structure 190 and then move toward the second light emitting area EA2. Then, the light L4 of the yellow wavelength range may again be reflected on the reflector 192 arranged on the second inclined surface 190d of the light guide structure 190 and move to the first color filter CF1.

Alternatively, the emitted light L4 of the yellow wavelength range may be reflected on the second electrode 230 and then move toward the light guide structure 190. Then, the light L4 of the yellow wavelength range may be reflected on the reflector 192 arranged on the first inclined surface 190c of the light guide structure 190 and move toward the second light emitting area EA2. Then, the light L4 of the yellow wavelength range may again be reflected on the reflector 192 arranged on the second inclined surface 190d of the light guide structure 190 and move to the first color filter CF1. The first color filter CF1 may transmit only the light L1 of the red wavelength range from the light L4 of the yellow wavelength range. Therefore, the first subpixel SP1 emits the light L1 of the red wavelength range from the second light emitting area EA2.

For example, the first subpixel SP1 emits the light L3 of the blue wavelength range and the light L1 of the red wavelength range.

The light L3 emitted from the second light emitting layer 240 may be emitted from the first light emitting area EA1 of the second subpixel SP2. If the third voltage is applied to the third electrode 250 and the second voltage is applied to the second electrode 230, the second light emitting layer 240 may emit the light L3 of the blue wavelength range. At this time, the emitted light L3 of the blue wavelength range may move to the front by passing through the third electrode 250. Alternatively, after the emitted light L3 of the blue wavelength range is reflected on the second electrode 230, the light L3 may move to the front by passing through the third electrode 250. Therefore, the second subpixel SP2 emits the light L3 of the blue wavelength range from the first light emitting area EA1.

The light L2 of the green wavelength range in the light L4 emitted from the first light emitting layer 220 may be emitted from the second light emitting area EA2 of the second subpixel SP2. If the first voltage is applied to the first electrode 210 and the second voltage is applied to the second electrode 230, the first light emitting layer 220 may emit the light L4 of the yellow wavelength range where the light L1 of the red wavelength range is mixed with the light L2 of the green wavelength range. At this time, the emitted light L4 of the yellow wavelength range may be reflected on the reflector 192 arranged on the first inclined surface 190c of the light guide structure 190 and then move toward the second light emitting area EA2. Then, the light L4 of the yellow wavelength range may again be reflected on the reflector 192 arranged on the second inclined surface 190d of the light guide structure 190 and move to the second color filter CF2.

Alternatively, the emitted light L4 of the yellow wavelength range may be reflected on the second electrode 230 and then move toward the light guide structure 190. Then, the light L4 of the yellow wavelength range may be reflected on the reflector 192 arranged on the first inclined surface 190c of the light guide structure 190 and move toward the second light emitting area EA2. Then, the light L4 of the yellow wavelength range may again be reflected on the reflector 192 arranged on the second inclined surface 190d of the light guide structure 190 and move to the second color filter CF2. The second color filter CF2 may transmit only the light L2 of the green wavelength range from the light L4 of the yellow wavelength range. Therefore, the second subpixel SP2 emits the light L2 of the green wavelength range from the second light emitting area EA2.

For example, the second subpixel SP2 emits the light L3 of the blue wavelength range and the light L2 of the green wavelength range.

As a result, the first subpixel SP1 and the second subpixel SP2 may emit the light L3 of the blue wavelength range, the light L1 of the red wavelength range and the light L2 of the green wavelength range.

In the display device 100 according to the first embodiment of the present disclosure, each of the subpixels SP1 and SP2 may allow at least one of the first light emitting layer 220 and the second light emitting layer 240 to emit light.

For example, in the subpixels SP1 and SP2, a voltage may be applied to the first electrode 210 and the second electrode 230, whereby only the first light emitting layer 220 may emit light. In detail, in the subpixels SP1 and SP2, the first voltage for allowing the first light emitting layer 220 to emit light may be applied to the first electrode 210, the second voltage may be applied to the second electrode 230, and no voltage may be applied to the third electrode 250. Therefore, the first light emitting layer 220 provided between the first electrode 210 and the second electrode 230 may emit light while the second light emitting layer 240 provided between the second electrode 230 and the third electrode 250 may not emit light.

For another example, in the subpixels SP1 and SP2, a voltage may be applied to the second electrode 230 and the third electrode 250, whereby only the second light emitting layer 240 may emit light. In detail, in the subpixels SP1 and SP2, no voltage may be applied to the first electrode 210, the second voltage may be applied to the second electrode 230, and the third voltage for allowing the second light emitting layer 240 to emit light may be applied to the third electrode 250. Therefore, the first light emitting layer 220 provided between the first electrode 210 and the second electrode 230 may not emit light while the second light emitting layer 240 provided between the second electrode 230 and the third electrode 250 may emit light.

For other example, in the subpixels SP1 and SP2, a voltage may be applied to the first electrode 210, the second electrode 230 and the third electrode 250, whereby both the first light emitting layer 220 and the second light emitting layer 240 may emit light. In detail, in the subpixels SP1 and SP2, the first voltage for allowing the first light emitting layer 220 to emit light may be applied to the first electrode 210, the second voltage may be applied to the second electrode 230, and the third voltage for allowing the second light emitting layer 240 to emit light may be applied to the third electrode 250. Therefore, the first light emitting layer 220 provided between the first electrode 210 and the second electrode 230 and the second light emitting layer 240 provided between the second electrode 230 and the third electrode 250 may emit light at the same time.

As described above, in the display device 100 according to the first embodiment of the present disclosure, each of the subpixels SP1 and SP2 may allow the first light emitting layer 220 and the second light emitting layer 240 to independently emit light. Therefore, in the present disclosure, power consumption may be reduced more remarkably than the display device having a tandem structure in which a plurality of stacks are arranged by interposing a charge generating layer therebetween.

Meanwhile, in the display device of the related art, the interval between the subpixels should have a certain value or more to form the light emitting layers of different color for each of the subpixels through patterning. For example, the red light emitting layer may be formed to be patterned in the first subpixel, the green light emitting layer may be formed to be patterned in the second subpixel, and the blue light emitting layer may be formed to be patterned in the third subpixel. In this case, after the opening portion of a fine metal mask (FMM) is aligned in the first subpixel, the red light emitting layer may be deposited on the first subpixel. At this time, the red light emitting layer may partially be deposited on the second subpixel and the third subpixel, which are covered by the FMM through the opening portion of the FMM. To prevent this, the interval between the subpixels may be spaced apart from each other at a certain value or more such that the red light emitting layer may not be deposited on the second subpixel and the third subpixel.

Meanwhile, after the red light emitting layer is formed to be patterned in the first subpixel, the opening portion of the FMM is aligned in the second subpixel and then the green light emitting layer may be deposited on the second subpixel. After the green light emitting layer is formed to be patterned in the second subpixel, the opening portion of the FMM is aligned in the third subpixel and then the blue light emitting layer may be deposited on the third subpixel. In this way, in order that the light emitting layers of different colors for each of the subpixels are formed, movement and alignment of the FMM may be repeated. At this time, considering a process error according to movement and alignment of the FMM, the subpixels should be spaced apart from each other at a certain value or more.

For this reason, the display device for forming and patterning the light emitting layers of different colors for each of the subpixels using the FMM has a limitation in reducing the interval between the subpixels.

In the display device 100 according to the first embodiment of the present disclosure, the light emitting layers 220 and 240 are formed to be patterned in only the first light emitting area EA1, and are not formed in the second light emitting area EA2. In the display device 100 according to the first embodiment of the present disclosure, the second light emitting area EA2 exists between the first light emitting area EA1 of the first subpixel SP1 and the first light emitting area EA1 of the second subpixel SP2.

Also, in the display device 100 according to the first embodiment of the present disclosure, the same light emitting layers 220 and 240 are formed to be patterned in the first subpixel SP1 and the second subpixel SP2. Since the light emitting layer different for each of the subpixels SP1 and SP2 may not be formed, the display device 100 according to the first embodiment of the present disclosure does not need to move the FMM.

Therefore, in the display device 100 according to the first embodiment of the present disclosure, the interval between the first subpixel SP1 and the second subpixel SP2 may be minimized even though the light emitting layers 220 and 240 are formed to be patterned using the FMM.

Also, in the display device 100 according to the first embodiment of the present disclosure, since the second electrode 230 is formed as the reflective electrode, the light emitted from the second light emitting layer 240, for example, the blue light may be reflected on the second electrode 230 and then emitted to the front. The display device 100 according to the first embodiment of the present disclosure may maintain light efficiency equivalent to the display device of the related art in which the light emitting layers of different colors for each of the subpixels are formed to be patterned using the FMM.

Also, in the display device 100 according to the first embodiment of the present disclosure, since the second electrode 230 is formed as the reflective electrode, after the lights emitted from the first light emitting layer 220, for example, the red light and the green light are reflected on the second electrode 230, the lights may again be reflected from the light guide structure 190 and then emitted to the front. The display device 100 according to the first embodiment of the present disclosure may provide an improved light extraction effect through the light guide structure 190.

Second Embodiment

Figure 11:
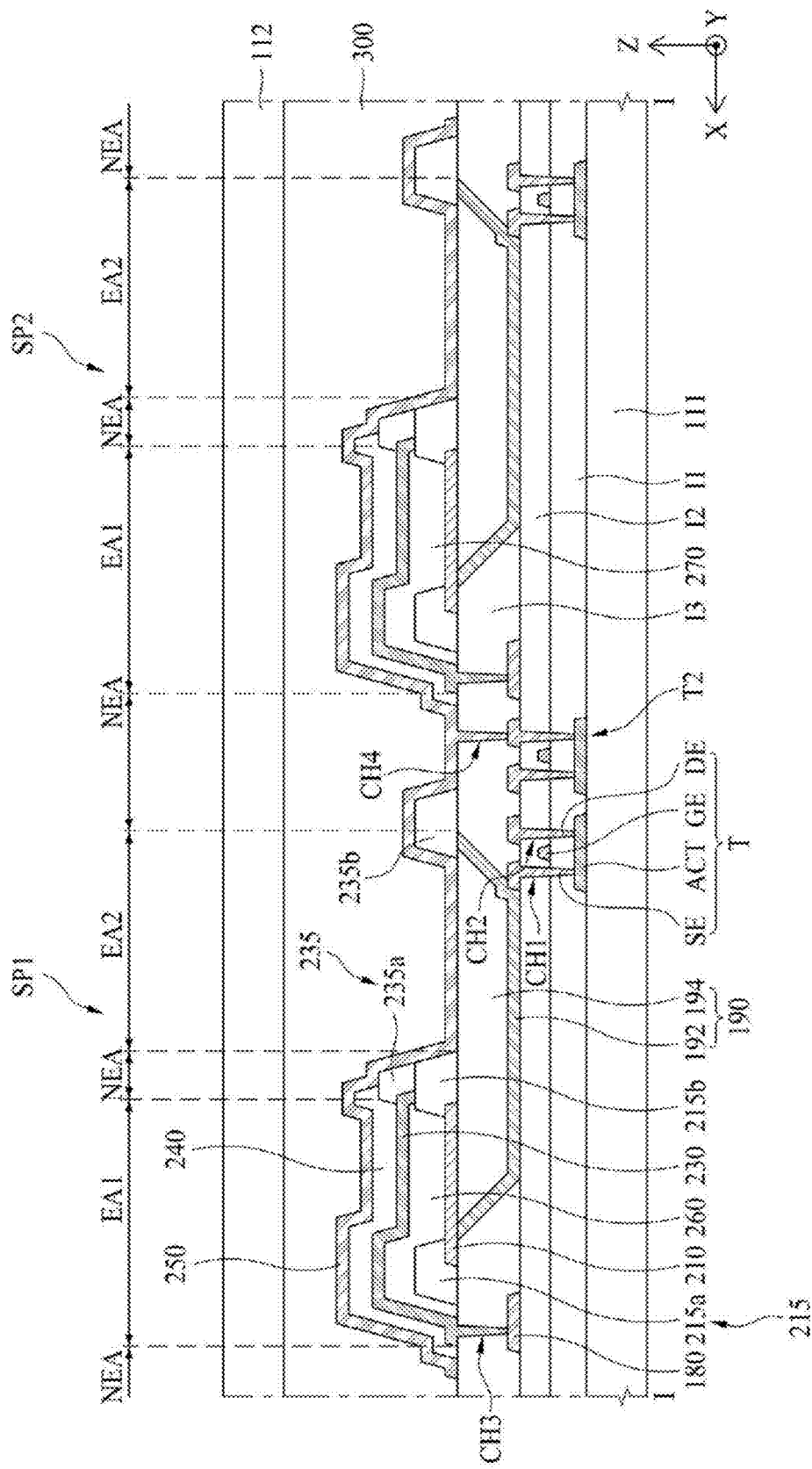
FIG. 11 is a cross-sectional view illustrating a second example taken along line I-I of FIG. 3.
Figure 12:
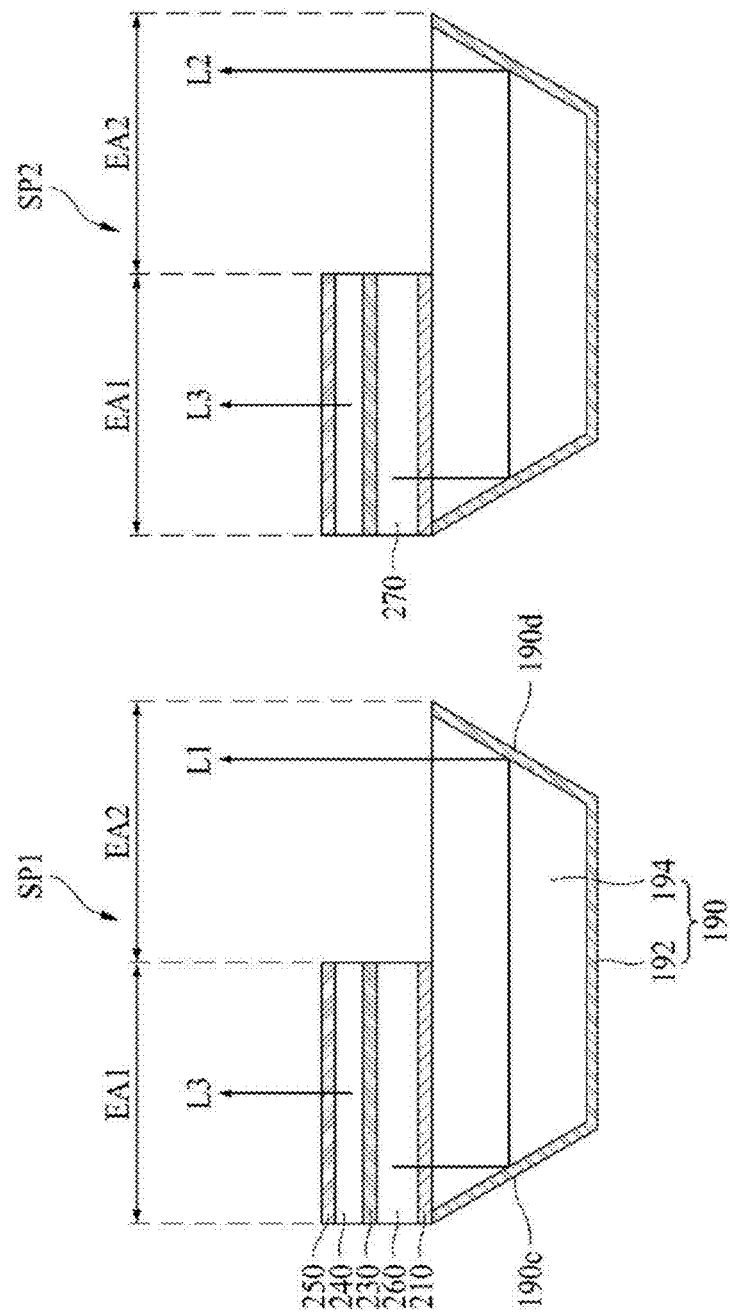
FIG. 12 is a view briefly illustrating a path of light in a first subpixel and a second subpixel of FIG. 11.

FIG. 11 is a cross-sectional view illustrating a second example taken along line I-I of FIG. 3, and FIG. 12 is a view briefly illustrating a path of light in a first subpixel and a second subpixel of FIG. 11.

With reference to FIGS. 11 and 12, the display device according to the second embodiment of the present disclosure comprises a first substrate 111, a second substrate 112, a first driving thin film transistor T1, a second driving thin film transistor T2, a power line 180, a light guide structure 190, a first electrode 210, a first bank 215, a second bank 235, a third light emitting layer 260, a fourth light emitting layer 270, a second electrode 230, a second light emitting layer 240, a third electrode 250, and an encapsulation layer 300. Thus, in the first and the second embodiment, the second TFT T2 and the third electrode 250 may be shared by the first and the second subpixels SP1 and SP2 of one pixel P. The third electrode 250 may extend over the first and the second light emitting areas EA1 and EA2 of both the first and the second subpixels SP1 and SP2.

The display device 100 according to the second embodiment of the present disclosure is different from the display device 100 according to the first embodiment of the present disclosure shown in FIG. 5 in that the display device 100 according to the second embodiment of the present disclosure comprises the third light emitting layer 260 and the fourth light emitting layer 270. Therefore, in the display device 100 according to the second embodiment of the present disclosure, elements except the third light emitting layer 260 and the fourth light emitting layer 270 are substantially the same as those of the display device 100 according to the first embodiment of the present disclosure shown in FIG. 5. For example, the first light emitting layer 220 of the first subpixel SP1 in the first embodiment may be replaced by the third light emitting layer 260, and the first light emitting layer 220 of the second subpixel SP2 in the first embodiment may be replaced by the fourth light emitting layer 270. Hereinafter, a detailed description of the first substrate 111, the second substrate 112, the first driving thin film transistor T1, the second driving thin film transistor T2, the power line 180, the light guide structure 190, the first electrode 210, the first bank 215, the second bank 235, the second electrode 230, the third electrode 250, and the encapsulation layer 300 of the display device 100 according to the second embodiment of the present disclosure will be omitted.

A first subpixel SP1 and a second subpixel SP2 may be provided on the first substrate 111. The first subpixel SP1 may be provided to emit blue (B) and red (R) lights, and the second subpixel SP2 may be provided to emit blue (B) and green (G) lights, but these subpixels are not limited to this case. Also, an arrangement sequence of the subpixels SP1 and SP2 may be changed in various ways.

Hereinafter, for convenience of description, it is assumed that the first subpixel SP1 emits blue (B) and green (G) lights, and the second subpixel SP2 may emit blue (B) and red (R) lights.

The third light emitting layer 260 is formed in the first subpixel SP1. The third light emitting layer 260 is provided on the first electrode 210. The third light emitting layer 260 may also be provided on the first bank 215. Particularly, the third light emitting layer 260 may be provided on a first side, an upper surface and a second side of a first bank 215a formed to cover one end of the first electrode 210 on the planarization film I3, wherein the second side of the first bank 215a faces its first side. However, without limitation to this example, in another embodiment, the third light emitting layer 260 may be provided on only a portion of the first side and the upper surface of the first bank 215a provided on the planarization film I3 to cover one end of the first electrode 210.

The third light emitting layer 260 may include a hole transporting layer, a light emitting layer, and an electron transporting layer. If a fourth voltage is applied to the first electrode 210 and a second voltage is applied to the second electrode 230, holes and electrons move to the third light emitting layer 260 through the hole transporting layer and the electron transporting layer, respectively, and are combined with each other in the corresponding light emitting layer to emit light of a predetermined color.

The third light emitting layer 260 may be any one of, but not limited to, a red light emitting layer for emitting red light, a green light emitting layer for emitting green light, a blue light emitting layer for emitting blue light, and a yellow light emitting layer for emitting yellow light.

The fourth light emitting layer 270 is provided in the second subpixel SP2. The fourth light emitting layer 270 is provided on the first electrode 210. The fourth light emitting layer 270 may also be provided on the first bank 215. Particularly, the fourth light emitting layer 270 may be provided on a first side, an upper surface and a second side of the first bank 215a formed to cover one end of the first electrode 210 on the planarization film I3, wherein the second side of the first bank 215a faces its first side. However, without limitation to this example, in another embodiment, the fourth light emitting layer 270 may be provided on only a portion of the first side and the upper surface of the first bank 215a provided on the planarization film I3 to cover one end of the first electrode 210.

The fourth light emitting layer 270 may include a hole transporting layer, a light emitting layer, and an electron transporting layer. If a fifth voltage is applied to the first electrode 210 and a second voltage is applied to the second electrode 230, holes and electrons move to the fourth light emitting layer 270 through the hole transporting layer and the electron transporting layer, respectively, and are combined with each other in the light emitting layer to emit light of a predetermined color.

The fourth light emitting layer 270 may be any one of, but not limited to, a red light emitting layer for emitting red light, a green light emitting layer for emitting green light, a blue light emitting layer for emitting blue light, and a yellow light emitting layer for emitting yellow light.

However, the fourth light emitting layer 270 may emit light of a color different from that of the third light emitting layer 260. If the third light emitting layer 260 is a light emitting layer for emitting light of a first color wavelength range, the fourth light emitting layer 270 may be a light emitting layer for emitting light of a third color wavelength range. For example, the third light emitting layer 260 may be a red light emitting layer for emitting light of a red wavelength range, and the fourth light emitting layer 270 may be a green light emitting layer for emitting light of a green wavelength range.

The second light emitting layer 240 is formed to be patterned in each of the first subpixel SP1 and the second subpixel SP2. One second light emitting layer 240 is provided in the first subpixel SP1, and the other second light emitting layer 240 is provided in the second subpixel SP2.

The second light emitting layer 240 is provided on the second electrode 230. The second light emitting layer 240 may be provided on the second bank 235.

The second light emitting layer 240 may include a hole transporting layer, a light emitting layer, and an electron transporting layer. If a third voltage is applied to the third electrode 250 and a second voltage is applied to the second electrode 230, holes and electrons move to the second light emitting layer 240 through the hole transporting layer and the electron transporting layer, respectively, and are combined with each other in the corresponding light emitting layer to emit light of a predetermined color.

The second light emitting layer 240 may be any one of, but not limited to, a red light emitting layer for emitting red light, a green light emitting layer for emitting green light, a blue light emitting layer for emitting blue light, and a yellow light emitting layer for emitting yellow light.

However, the second light emitting layer 240 may emit light of a color different from that of each of the third light emitting layer 260 and the fourth light emitting layer 270. If the third light emitting layer 260 is a light emitting layer for emitting light of a first color wavelength range and the fourth light emitting layer 270 is a light emitting layer for emitting light of a second color wavelength range, the second light emitting layer 240 may be a light emitting layer for emitting light of a third color wavelength range. For example, the third light emitting layer 260 may be a red light emitting layer for emitting light of a red wavelength range, the fourth light emitting layer 270 may be a green light emitting layer for emitting light of a green wavelength range, and the second light emitting layer 240 may be a blue light emitting layer for emitting light of a blue wavelength range.

In the display device 100 according to the second embodiment of the present disclosure, although one pixel P includes two subpixels SP1 and SP2, lights of at least three colors may be emitted from the two subpixels SP1 and SP2.

For example, the third light emitting layer 260 may be a red light emitting layer for emitting light L1 of a red wavelength range, and the fourth light emitting layer 270 may be a green light emitting layer for emitting light L2 of a green wavelength range, and the second light emitting layer 240 may be a blue light emitting layer for emitting light L3 of a blue wavelength range.

Each of the first subpixel SP1 and the second subpixel SP2, as shown in FIG. 12, includes a first light emitting area EA1 and a second light emitting area EA2.

The light L3 emitted from the second light emitting layer 240 may be emitted from the first light emitting area EA1 of the first subpixel SP1. If the third voltage is applied to the third electrode 250 and the second voltage is applied to the second electrode 230, the second light emitting layer 240 may emit the light L3 of the blue wavelength range. At this time, the emitted light L3 of the blue wavelength range may move to the front by passing through the third electrode 250. Alternatively, after the emitted light L3 of the blue wavelength range is reflected on the third electrode 250, the light L3 may move to the front by passing through the third electrode 250. Therefore, the first subpixel SP1 emits the light L3 of the blue wavelength range from the first light emitting area EA1.

The light L1 emitted from the third light emitting layer 260 may be emitted from the second light emitting area EA2 of the first subpixel SP1. If a fourth voltage is applied to the first electrode 210 and a second voltage is applied to the second electrode 230, the third light emitting layer 260 may emit the light L1 of the red wavelength range. At this time, the light L1 of the red wavelength range may be reflected on the reflector 192 arranged on the first inclined surface 190c of the light guide structure 190 and then move toward the second light emitting area EA2. Then, the light L1 of the red wavelength range may again be reflected on the reflector 192 arranged on the second inclined surface 190d of the light guide structure 190 and move to the front.

Alternatively, the emitted light L1 of the red wavelength range may be reflected on the second electrode 230 and then move toward the light guide structure 190. Then, the light L1 of the red wavelength range may be reflected on the reflector 192 arranged on the first inclined surface 190c of the light guide structure 190 and move toward the second light emitting area EA2. Then, the light L1 of the red wavelength range may again be reflected on the reflector 192 arranged on the second inclined surface 190d of the light guide structure 190 and move to the front. Therefore, the first subpixel SP1 emits the light L1 of the red wavelength range from the second light emitting area EA2.

For example, the first subpixel SP1 emits the light L3 of the blue wavelength range and the light L1 of the red wavelength range.

The light L3 emitted from the second light emitting layer 240 may be emitted from the first light emitting area EA1 of the second subpixel SP2. If the third voltage is applied to the third electrode 250 and the second voltage is applied to the second electrode 230, the second light emitting layer 240 may emit the light L3 of the blue wavelength range. At this time, the emitted light L3 of the blue wavelength range may move to the front by passing through the third electrode 250. Alternatively, after the emitted light L3 of the blue wavelength range is reflected on the second electrode 230, the light L3 may move to the front by passing through the third electrode 250. Therefore, the second subpixel SP2 emits the light L3 of the blue wavelength range from the first light emitting area EA1.

The light L2 emitted from the fourth light emitting layer 270 may be emitted from the second light emitting area EA2 of the second subpixel SP2. If a fifth voltage is applied to the first electrode 210 and the second voltage is applied to the second electrode 230, the fourth light emitting layer 270 may emit the light L2 of the green wavelength range. At this time, the emitted light L2 of the green wavelength range may be reflected on the reflector 192 arranged on the first inclined surface 190c of the light guide structure 190 and move toward the second light emitting area EA2. Then, the light L2 of the green wavelength range may again be reflected on the reflector 192 arranged on the second inclined surface 190d of the light guide structure 190 and move to the front.

Alternatively, after the emitted light L2 of the green wavelength range is reflected on the second electrode 230, the light L2 may move toward the light guide structure 190. Then, the light L2 of the green wavelength range may be reflected on the reflector 192 arranged on the first inclined surface 190c of the light guide structure 190 and move toward the second light emitting area EA2. Then, the light L2 of the green wavelength range may again be reflected on the reflector 192 arranged on the second inclined surface 190d of the light guide structure 190 and move to the front. Therefore, the second subpixel SP2 emits the light L2 of the green wavelength range from the second light emitting area EA2.

For example, the second subpixel SP2 emits the light L3 of the blue wavelength range and the light L2 of the green wavelength range.

As a result, the first subpixel SP1 and the second subpixel SP2 may emit the light L3 of the blue wavelength range, the light L1 of the red wavelength range and the light L2 of the green wavelength range.

In the display device 100 according to the second embodiment of the present disclosure, the third light emitting layer 260 is provided in the first subpixel SP1, and the fourth light emitting layer 270 is provided in the second subpixel SP2. The light emitted from the third light emitting layer 260 of the first subpixel SP1 may be guided to the second light emitting area EA2 through the light guide structure 190 and then emitted to the front. At this time, in the display device 100 according to the second embodiment of the present disclosure unlike the display device 100 according to the first embodiment of the present disclosure, the light emitted from the third light emitting layer 260 of the first subpixel SP1 and the light emitted from the fourth light emitting layer 270 of the second subpixel SP2 may be emitted without passing through a color filter, whereby light efficiency may be improved.

Third Embodiment

Figure 13:
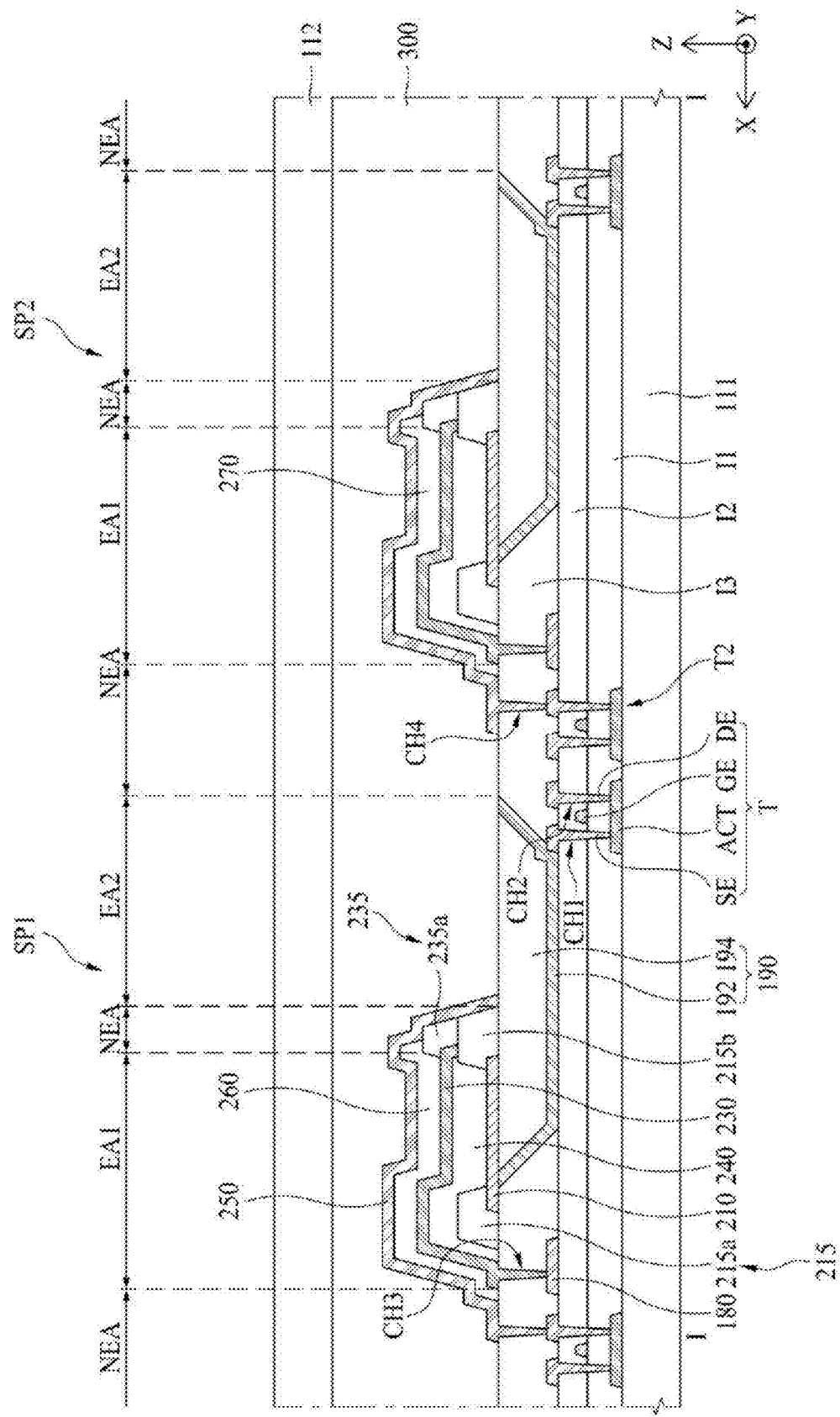
FIG. 13 is a cross-sectional view illustrating a third example taken along line I-I of FIG. 3.

FIG. 13 is a cross-sectional view illustrating a third example taken along line I-I of FIG. 3, and FIG. 14 is a view briefly illustrating a path of light in a first subpixel and a second subpixel of FIG. 13.

With reference to FIGS. 13 and 14, the display device according to the third embodiment of the present disclosure comprises a first substrate 111, a second substrate 112, a first driving thin film transistor T1, a second driving thin film transistor T2, a power line 180, a light guide structure 190, a first electrode 210, a first bank 215, a second bank 235, a second light emitting layer 240, a second electrode 230, a third light emitting layer 260, a fourth light emitting layer 270, a third electrode 250, and an encapsulation layer 300.

The display device 100 according to the third embodiment of the present disclosure is different from the display device 100 according to the first embodiment of the present disclosure shown in FIG. 5 in that the display device 100 according to the third embodiment of the present disclosure comprises the third light emitting layer 260 and the fourth light emitting layer 270. Therefore, in the display device 100 according to the third embodiment of the present disclosure, elements except the second driving thin film transistor T2, the second light emitting layer 240, the third light emitting layer 260, the fourth light emitting layer 270 and the third electrode are substantially the same as those of the display device 100 according to the first embodiment of the present disclosure shown in FIG. 5. Hereinafter, a detailed description of the first substrate 111, the second substrate 112, the first driving thin film transistor T1, the power line 180, the light guide structure 190, the first electrode 210, the first bank 215, the second bank 235, the second electrode 230 and the encapsulation layer 300 of the display device 100 according to the third embodiment of the present disclosure will be omitted.

A first subpixel SP1 and a second subpixel SP2 may be provided on the first substrate 111. The first subpixel SP1 may be provided to emit blue (B) and green (G) lights, and the second subpixel SP2 may be provided to emit blue (B) and red (R) lights, but these subpixels are not limited to this case. Also, an arrangement sequence of the subpixels SP1 and SP2 may be changed in various ways.

Hereinafter, for convenience of description, it is assumed that the first subpixel SP1 emits blue (B) and red (R) lights, and the second subpixel SP2 may emit blue (B) and green (G) lights.

The second driving thin film transistor T2 is provided for each of the subpixels SP1 and SP2, unlike the second driving thin film transistor T2 of the first and second embodiments, e.g. shown in FIGS. 5 and 8 to 11. The second driving thin film transistor T2 is configured to supply a predetermined voltage to the third electrode 250 in accordance with the data voltage of the data line if the gate signal is input to the gate line.

The second light emitting layer 240 is formed to be patterned in each of the first subpixel SP1 and the second subpixel SP2. For example, the second light emitting layer 240 is formed respectively in the first light emitting areas EA1 of the first and second subpixels SP1 and SP2. One second light emitting layer 240 is provided in the first subpixel SP1, and the other second light emitting layer 240 is provided in the second subpixel SP2. The second light emitting layers 240 of the first and second subpixels SP1 and SP2 of one pixel may emit light of the same wavelength, e.g., may be made of the same material.

The second light emitting layer 240 is provided on the first electrode 210. The second light emitting layer 240 may also be provided on the first bank 215. Particularly, the second light emitting layer 240 may be provided on a first side, an upper surface and a second side of a first bank 215a formed to cover one end of the first electrode 210 on the planarization film I3, wherein the second side of the first bank 215a faces its first side. However, without limitation to this example, in another embodiment, the second light emitting layer 240 may be provided on only a portion of the first side and the upper surface of the first bank 215a which is provided on the planarization film I3 to cover one end of the first electrode 210, e.g. as shown in FIG. 9.

The second light emitting layer 240 may include a hole transporting layer, a light emitting layer, and an electron transporting layer. If a third voltage is applied to the first electrode 210 and a second voltage is applied to the second electrode 230, holes and electrons move to the second light emitting layer 240 through the hole transporting layer and the electron transporting layer, respectively, and are combined with each other in the corresponding light emitting layer to emit light of a predetermined color.

The second light emitting layer 240 may be any one of, but not limited to, a red light emitting layer for emitting red light, a green light emitting layer for emitting green light, a blue light emitting layer for emitting blue light, and a yellow light emitting layer for emitting yellow light.

The third light emitting layer 260 is formed to be patterned in the first subpixel SP1. The third light emitting layer 260 is provided on the second electrode 230 of the first subpixel SP1. The third light emitting layer 260 may also be provided on the second bank 235.

The third light emitting layer 260 may include a hole transporting layer, a light emitting layer, and an electron transporting layer. If a fourth voltage is applied to the third electrode 250 and a second voltage is applied to the second electrode 230, holes and electrons move to the third light emitting layer 260 through the hole transporting layer and the electron transporting layer, respectively, and are combined with each other in the corresponding light emitting layer to emit light of a predetermined color.

The third light emitting layer 260 may be any one of, but not limited to, a red light emitting layer for emitting red light, a green light emitting layer for emitting green light, a blue light emitting layer for emitting blue light, and a yellow light emitting layer for emitting yellow light.

The fourth light emitting layer 270 is formed to be patterned on the second subpixel SP2. The fourth light emitting layer 270 is provided on the second electrode 230 of the second subpixel SP2. The fourth light emitting layer 270 may also be provided on the second bank 235.

The fourth light emitting layer 270 may include a hole transporting layer, a light emitting layer, and an electron transporting layer. If a fifth voltage is applied to the third electrode 250 and a second voltage is applied to the second electrode 230, holes and electrons move to the fourth light emitting layer 270 through the hole transporting layer and the electron transporting layer, respectively, and are combined with each other in the corresponding light emitting layer to emit light of a predetermined color.

The fourth light emitting layer 270 may be any one of, but not limited to, a red light emitting layer for emitting red light, a green light emitting layer for emitting green light, a blue light emitting layer for emitting blue light, and a yellow light emitting layer for emitting yellow light.

However, the fourth light emitting layer 270 may emit light of a color different from that of the third light emitting layer 260. If the third light emitting layer 260 is a light emitting layer for emitting light of a first color wavelength range, the fourth light emitting layer 270 may be a light emitting layer for emitting light of a second color wavelength range. For example, the third light emitting layer 260 may be a red light emitting layer for emitting light of a red wavelength range, and the fourth light emitting layer 270 may be a green light emitting layer for emitting light of a green wavelength range.

Meanwhile, the second light emitting layer 240 may emit light of a color different from that of each of the third light emitting layer 260 and the fourth light emitting layer 270. If the third light emitting layer 260 is a light emitting layer for emitting light of a first color wavelength range and the fourth light emitting layer 270 is a light emitting layer for emitting light of a second color wavelength range, the second light emitting layer 240 may be a light emitting layer for emitting light of a third color wavelength range. For example, the third light emitting layer 260 may be a red light emitting layer for emitting light of a red wavelength range, the fourth light emitting layer 270 may be a green light emitting layer for emitting light of a green wavelength range, and the second light emitting layer 240 may be a blue light emitting layer for emitting light of a blue wavelength range.

The third electrode 250, as shown in FIG. 13, is formed to be patterned in each of the first subpixel SP1 and the second subpixel SP2. One third electrode 250 is provided in the first subpixel SP1, and the other third electrode 250 is provided in the second subpixel SP2. In each of the first and the second subpixel SP1 and SP2, the third electrode 250 may be connected to the second driving thin film transistor T2 through a contact hole CH4 that passes through the planarization film I3. Therefore, a fourth voltage for allowing the third light emitting layer 260 to emit light may be applied from the source electrode SE or the drain electrode DE of the second driving thin film transistor T2 to the third electrode 250 provided in the first subpixel SP1. Also, a fifth voltage for allowing the fourth light emitting layer 270 to emit light may be applied from the source electrode SE or the drain electrode DE of the second driving thin film transistor T2 to the third electrode 250 provided in the second subpixel SP2.

In the display device 100 according to the third embodiment of the present disclosure, although one pixel P includes two subpixels SP1 and SP2, lights of at least three colors may be emitted from the two subpixels SP1 and SP2.

For example, the third light emitting layer 260 may be a red light emitting layer for emitting light L1 of a red wavelength range, and the fourth light emitting layer 270 may be a green light emitting layer for emitting light L2 of a green wavelength range, and the second light emitting layer 240 may be a blue light emitting layer for emitting light L3 of a blue wavelength range.

Each of the first subpixel SP1 and the second subpixel SP2, as shown in FIG. 14, includes a first light emitting area EA1 and a second light emitting area EA2.

The light L1 emitted from the third light emitting layer 260 may be emitted from the first light emitting area EA1 of the first subpixel SP1. If the fourth voltage is applied to the third electrode 250 and the second voltage is applied to the second electrode 230, the third light emitting layer 260 may emit the light L1 of the red wavelength range. At this time, the emitted light L1 of the red wavelength range may move to the front by passing through the third electrode 250. Alternatively, after the emitted light L1 of the red wavelength range is reflected on the second electrode 230, the light L1 may move to the front by passing through the third electrode 250. Therefore, the first subpixel SP1 emits the light L1 of the red wavelength range from the first light emitting area EA1.

The light L3 emitted from the second light emitting layer 240 may be emitted from the second light emitting area EA2 of the first subpixel SP1. If a third voltage is applied to the first electrode 210 and a second voltage is applied to the second electrode 230, the second light emitting layer 240 may emit the light L3 of the blue wavelength range. At this time, the light L3 of the blue wavelength range may be reflected on the reflector 192 arranged on the first inclined surface 190c of the light guide structure 190 and then move toward the second light emitting area EA2. Then, the light L3 of the blue wavelength range may again be reflected on the reflector 192 arranged on the second inclined surface 190d of the light guide structure 190 and move to the front.

Alternatively, the emitted light L3 of the blue wavelength range may be reflected on the second electrode 230 and then move toward the light guide structure 190. Then, the light L3 of the blue wavelength range may be reflected on the reflector 192 arranged on the first inclined surface 190c of the light guide structure 190 and move toward the second light emitting area EA2. Then, the light L3 of the blue wavelength range may again be reflected on the reflector 192 arranged on the second inclined surface 190d of the light guide structure 190 and move to the front. Therefore, the first subpixel SP1 emits the light L3 of the blue wavelength range from the second light emitting area EA2.

For example, the first subpixel SP1 emits the light L3 of the blue wavelength range and the light L1 of the red wavelength range.

The light L2 emitted from the fourth light emitting layer 270 may be emitted from the first light emitting area EA1 of the second subpixel SP2. If the fifth voltage is applied to the third electrode 250 and the second voltage is applied to the second electrode 230, the fourth light emitting layer 270 may emit the light L2 of the green wavelength range. At this time, the emitted light L2 of the green wavelength range may move to the front by passing through the third electrode 250. Alternatively, after the emitted light L2 of the green wavelength range is reflected on the second electrode 230, the light L2 may move to the front by passing through the third electrode 250. Therefore, the second subpixel SP2 emits the light L2 of the green wavelength range from the first light emitting area EA1.

The light L3 emitted from the second light emitting layer 240 may be emitted from the second light emitting area EA2 of the second subpixel SP2. If the third voltage is applied to the first electrode 210 and the second voltage is applied to the second electrode 230, the second light emitting layer 240 may emit the light L3 of the blue wavelength range. At this time, the emitted light L3 of the blue wavelength range may be reflected on the reflector 192 arranged on the first inclined surface 190c of the light guide structure 190 and move toward the second light emitting area EA2. Then, the light L3 of the blue wavelength range may again be reflected on the reflector 192 arranged on the second inclined surface 190d of the light guide structure 190 and move to the front.

Alternatively, after the emitted light L3 of the blue wavelength range is reflected on the second electrode 230, the light L3 may move toward the light guide structure 190. Then, the light L3 of the blue wavelength range may be reflected on the reflector 192 arranged on the first inclined surface 190c of the light guide structure 190 and move toward the second light emitting area EA2. Then, the light L3 of the blue wavelength range may again be reflected on the reflector 192 arranged on the second inclined surface 190d of the light guide structure 190 and move to the front. Therefore, the second subpixel SP2 emits the light L3 of the blue wavelength range from the second light emitting area EA2.

For example, the second subpixel SP2 emits the light L3 of the blue wavelength range and the light L2 of the green wavelength range.

As a result, the first subpixel SP1 and the second subpixel SP2 may emit the light L3 of the blue wavelength range, the light L1 of the red wavelength range and the light L2 of the green wavelength range.

In the display device 100 according to the third embodiment of the present disclosure, the light emitted from the second light emitting layer 240, for example, blue light may be emitted from the second light emitting area EA2. The light emitted from the second light emitting layer 240 may be guided to the second light emitting area EA2 through the light guide structure 190 and then emitted to the front. Therefore, light efficiency of the light emitted from the second light emitting layer 240 may be more improved than the display device of the related art in which light emitting layers of different colors for each of the subpixels are formed to be patterned using an FMM.

Figure 15A:
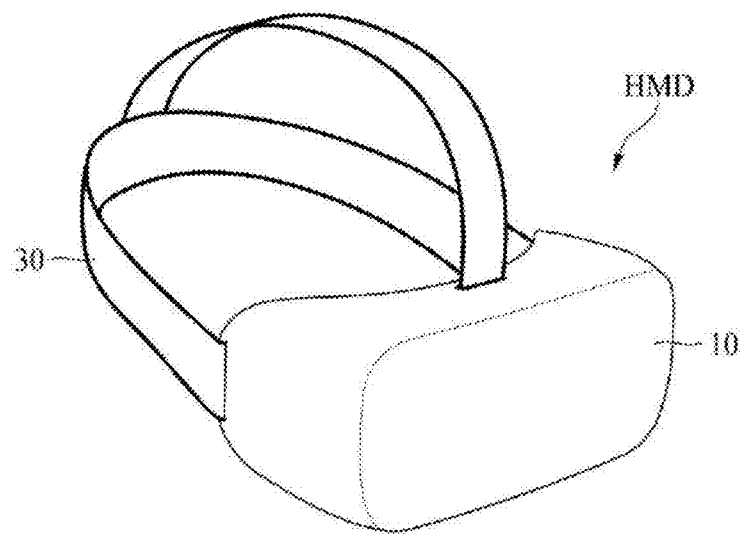
FIGS. 15A to 15C are views illustrating a display device according to another embodiment of the present disclosure, and relate to a head-mounted display (HMD) device.
Figure 15B:
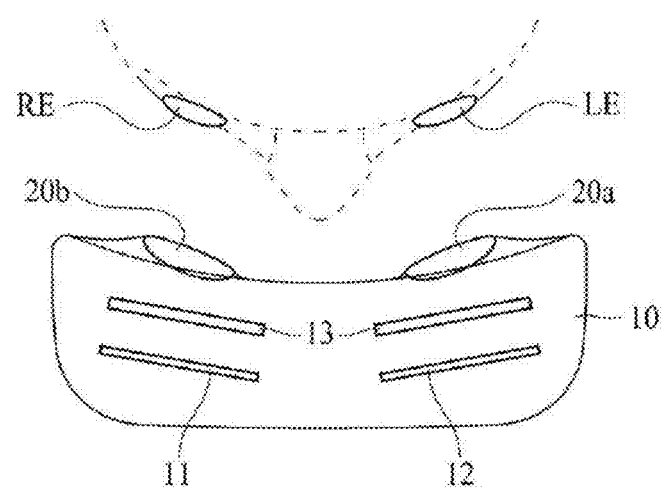
Figure 15C:
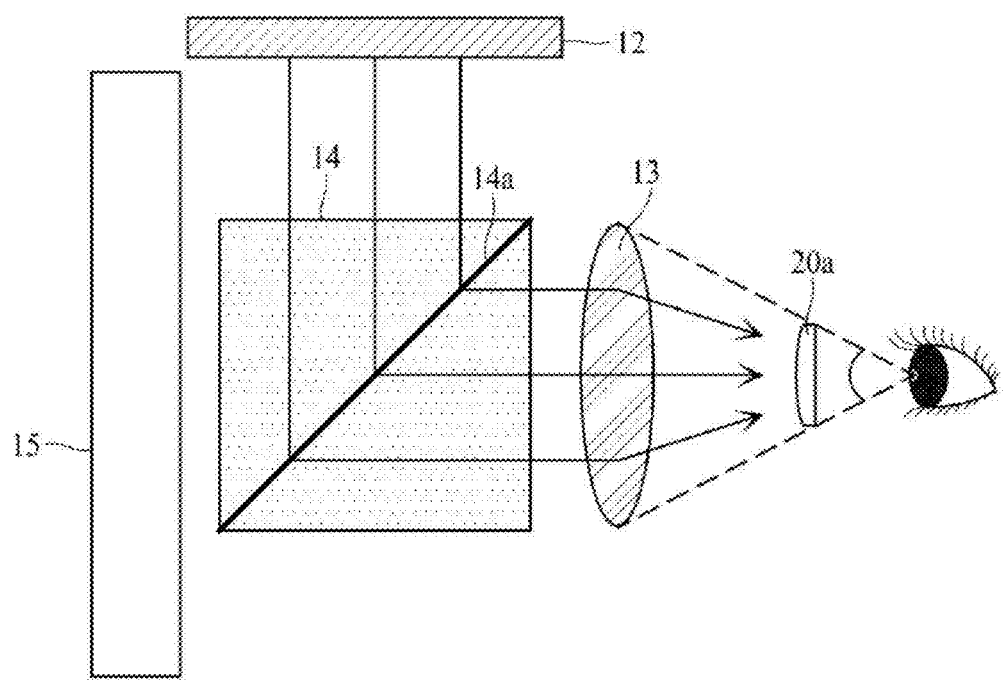

FIGS. 15A to 15C are views illustrating a display device according to another embodiment of the present disclosure, and relate to a head-mounted display (HMD) device. FIG. 15B is brief perspective view, FIG. 15B is a brief plane view of a virtual reality (VR) structure, and FIG. 15C is a brief cross-sectional view of an augmented reality (AR) structure.

As will be aware of it from FIG. 15A, a head mounted display device according to the present disclosure comprises a storage case 10, and a head mounted band 30.

The storage case 10 stores the display device, a lens array and an ocular lens therein.

The head mounted band 30 is fixed to the storage case 10. The head mounted band 30 is formed to surround a top surface and both sides of a user's head, but is not limited to this example. The head mounted band 30 is to fix a head mounted display to a user's head and may be replaced with a structure formed in a shape of a glasses frame or a helmet shape.

As will be aware of it from FIG. 15B, a head mounted display device of a virtual reality (VR) structure according to the present disclosure includes a left eye display device 12, a right eye display device 11, a lens array 13, a left eye ocular lens 20a, and a right eye ocular lens 20b.

The left eye display device 12, the right eye display device 11, the lens array 13, the left eye ocular lens 20a, and the right eye ocular lens 20b are stored in the aforementioned storage case 10.

The left eye display device 12 and the right eye display device 11 may display the same image, and in this case, a user may view 2D image. Alternatively, the left eye display device 12 may display a left eye image and the right eye display device 11 may display a right eye image, and in this case, a user may view a 3D image. Each of the left eye display device 12 and the right eye display device 11 may be comprised of a display device according to FIGS. 1 to 14 described above. In this case, an upper portion corresponding to a surface where an image is displayed in FIGS. 1 to 14, for example, a color filter layer 400 faces the lens array 13.

The lens array 13 may be provided between the left eye ocular lens 20a and the left eye display device 12 by being spaced apart from each of the left eye ocular lens 20a and the left eye display device 12. For example, the lens array 13 may be arranged in front of the left eye ocular lens 20a and behind the left eye display device 12. Also, the lens array 13 may be provided between the right eye ocular lens 20b and the right eye display device 11 by being spaced apparat from each of the right eye ocular lens 20b and the right eye display device 11. For example, the lens array 13 may be arranged in front of the right eye ocular lens 20b and behind the right eye display device 11.

The lens array 13 may be a micro lens array. The lens array 13 may be replaced with a pin hole array. Due to the lens array 13, images displayed on the left eye display device 12 or the right eye display device 11 may be viewed to be magnified to a user.

A left eye LE of a user may be arranged in the left eye ocular lens 20a, and a right eye RE of a user may be arranged in the right eye ocular lens 20b.

As will be aware of it from FIG. 15C, a head mounted display device of an AR structure according to the present disclosure includes a left eye display device 12, a lens array 13, a left eye ocular lens 20a, a transmissive reflection portion 14, and a transmissive window 15. Although only a structure for a left eye is shown in FIG. 15C for convenience, a structure for a right eye is the same as the structure for the left eye.

The left eye display device 12, the lens array 13, the left eye ocular lens 20a, the transmissive reflection portion 14, and the transmissive window 15 are stored in the aforementioned storage case 10.

The left eye display device 12 may be arranged at one side of the transmissive reflection portion 13, for example, at an upper side, without covering the transmissive window 15. Therefore, the left eye display device 12 may provide the transmissive reflection portion 14 with an image without covering an outer background viewed through the transmissive window 11.

The left eye display device 12 may be comprised of an electroluminescence display device according to FIGS. 1 to 14 described above. In this case, the top portion corresponding to the surface where images are displayed in FIGS. 1 to 14, for example, a color filter layer 400 faces the transmissive reflection portion 14.

The lens array 13 may be provided between the left eye ocular lens 20a and the transmissive reflection portion 14.

A left eye of a user is arranged in the left eye ocular lens 20a.

The transmissive reflection portion 14 is arranged between the lens array 13 and the transmissive window 15. The transmissive reflection portion 14 may include a reflective surface 14a which transmits a portion of light and reflects another portion of light. The reflective surface 14a is formed to make an image displayed on the left eye display device 12 to proceed to the lens array 13. Therefore, a user may view all of images displayed on the left eye display device 12 and an outer background through the transmissive window 15. For example, since the user may view one image by overlapping background in reality with virtual images, augmented reality (AR) may be embodied.

The transmissive window 15 is arranged in front of the transmissive reflection portion 14.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:
1. A display device, comprising:
 a substrate provided with a plurality of pixels each having a first and a second subpixel,
 wherein each subpixel includes:
  a first light emitting area and a second light emitting area;
  a first electrode in the first light emitting area;
  a first light emitting layer provided on the first electrode;

a second electrode provided on the first light emitting layer;

a second light emitting layer provided on the second electrode;

a third electrode provided on the second light emitting layer; and a reflective light guide structure provided between the substrate and the first electrode in the first light emitting area and extending over the second light emitting area, so that light emitted by the first light emitting layer in the first light emitting area is guided to the second light emitting area to be emitted therefrom, and wherein the reflective light guide structure includes a lower surface having a first width, an upper surface having a second width greater than the first width, and first and second inclined surfaces for connecting the lower surface with the upper surface.

2. The display device of claim 1, wherein the second electrode is a reflective electrode, and the first electrode and the third electrode are transparent electrodes.

3. The display device of claim 1, wherein the second electrode is configured to reflect light emitted from the first light emitting layer toward the reflective light guide structure and/or light emitted from the second light emitting layer toward the third electrode.

4. The display device of claim 3, wherein the reflective light guide structure includes a reflector forming a reflective space for guiding the light emitted from the first light emitting layer to the second light emitting area by reflecting the light.

5. The display device of claim 4, further comprising a first driving thin film transistor provided on the substrate, wherein the reflector of the reflective light guide structure electrically connects a source electrode or a drain electrode of the first driving thin film transistor to the first electrode.

6. The display device of claim 1, wherein the reflective light guide structure includes a first area overlapped with the first electrode and a second area exposed by the first electrode.

7. The display device of claim 1, further comprising a second driving thin film transistor provided on the substrate, wherein the third electrode is connected to a source electrode or a drain electrode of the second driving thin film transistor.

8. The display device of claim 7, wherein the third electrode provided in the first subpixel and the third electrode provided in the second subpixel of one pixel are connected with each other and one second driving thin film transistor is commonly provided for the two subpixels of one pixel.

9. The display device claim 1, wherein the third electrode is formed separately in each of first and second subpixels of one pixel, the third electrode of each subpixel being connected to a respective second driving thin film transistor.

10. The display device of claim 1, wherein the first light emitting layer and the second light emitting layer of one subpixel are configured to emit light of different color wavelength ranges.

11. The display device of claim 1, wherein in each pixel: the first light emitting area of the first subpixel and the first light emitting area of the second subpixel are configured to emit light of a first color wavelength range, the second light emitting area of the first subpixel is configured to emit light of a second color wavelength range, and the second light emitting area of the second subpixel is configured to emit light of a third color wavelength range, wherein the first, the second and the third color wavelength ranges are all different from each other, or the second light emitting area of the first subpixel and the second light emitting area of the second subpixel are configured to emit light of a first color wavelength range, the first light emitting area of the first subpixel is configured to emit light of a second color wavelength range, and the first light emitting area of the second subpixel is configured to emit light of a third color wavelength range, wherein the first, the second and the third color wavelength ranges are all different from each other.

12. The display device of claim 1, wherein each subpixel further comprises a color filter in the second light emitting area, the color filter being configured for emitting only a part of the light emitted from the first light emitting layer.

13. The display device of claim 1, wherein in each pixel, the first subpixel is configured to emit light of a first color wavelength range and light of a third color wavelength range and the second subpixel is configured to emit light of a second color wavelength range and light of a third color wavelength range, wherein the first, the second and the third color wavelength ranges are all different from each other.

14. The display device of claim 1, wherein in each pixel:
the first light emitting layer of the first subpixel and the first light emitting layer of the second subpixel are made of the same material and configured to emit at the same color wavelength range and the second light emitting layer of the first subpixel and the second light emitting layer of the second subpixel are made of different materials and configured to emit at different color wavelength ranges, or the first light emitting layer of the first subpixel and the first light emitting layer of the second subpixel are made of different materials and configured to emit at different color wavelength ranges and the second light emitting layer of the first subpixel and the second ligh emitting layer of the second subpixel are made of the same material and configured to emit at the same color wavelength range, or the first light emitting layer of the first subpixel and the first light emitting layer of the second subpixel are made of the same material and configured to emit at the same color wavelength range and the second light emitting layer of the first subpixel and the second light emitting layer of the second subpixel are made of the same material and configured to emit at the same color wavelength range.

15. A head-mounted display, comprising:
a storage case; and
a head mounted band fixed to the storage case, wherein the storage case stores therein the display device according to claim 1, an ocular lens, and a lens array arranged between said display device and the ocular lens.

16. The head-mounted display according to claim 15, wherein the ocular lens comprises a left eye ocular lens and a right eye ocular lens, and said display device comprises a left eye display device and a right eye display device.

* * * * *